United States Patent
Kalman et al.

(10) Patent No.: US 12,244,355 B2
(45) Date of Patent: *Mar. 4, 2025

(54) INTERCONNECT NETWORKS USING MICROLED-BASED OPTICAL LINKS

(71) Applicant: AvicenaTech Corp., Mountain View, CA (US)

(72) Inventors: Robert Kalman, Mountain View, CA (US); Bardia Pezeshki, Mountain View, CA (US); Alexander Tselikov, Mountain View, CA (US); Cameron Danesh, Mountain View, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/495,689

(22) Filed: Oct. 26, 2023

(65) Prior Publication Data

US 2024/0137132 A1 Apr. 25, 2024
US 2024/0235697 A9 Jul. 11, 2024

Related U.S. Application Data

(63) Continuation of application No. 17/229,525, filed on Apr. 13, 2021, now Pat. No. 11,824,590.

(60) Provisional application No. 63/009,199, filed on Apr. 13, 2020.

(51) Int. Cl.
| | | |
|---|---|---|
| *H04B 10/25* | (2013.01) | |
| *G02B 6/43* | (2006.01) | |
| *H01L 33/00* | (2010.01) | |
| *H04B 10/27* | (2013.01) | |
| *H04B 10/40* | (2013.01) | |
| *H04B 10/80* | (2013.01) | |
| *H04J 14/02* | (2006.01) | |
| *H01L 33/10* | (2010.01) | |

(52) U.S. Cl.
CPC ............. *H04B 10/803* (2013.01); *G02B 6/43* (2013.01); *H01L 33/0045* (2013.01); *H04B 10/25* (2013.01); *H04B 10/27* (2013.01); *H04B 10/40* (2013.01); *H04J 14/0217* (2013.01); *H01L 33/10* (2013.01)

(58) Field of Classification Search
CPC ........ H04B 10/25; H04B 10/27; H04B 10/40; H04J 14/0217; G02B 6/43
USPC .......................................... 398/139, 142, 164
See application file for complete search history.

(56) References Cited

U.S. PATENT DOCUMENTS

| | | | | |
|---|---|---|---|---|
| 6,845,184 B1 * | 1/2005 | Yoshimura | ............... | H01L 23/48 385/9 |
| 10,585,250 B2 * | 3/2020 | Jou | ........................ | G02B 6/425 |
| 11,824,590 B2 * | 11/2023 | Kalman | .................. | H04B 10/27 |
| 2002/0158792 A1 * | 10/2002 | Forsberg | .............. | H04B 10/803 342/194 |
| 2015/0333831 A1 * | 11/2015 | Lai | .......................... | G02B 6/428 250/208.2 |
| 2016/0020353 A1 * | 1/2016 | Chu | ........................ | H01L 24/97 257/21 |
| 2017/0040306 A1 * | 2/2017 | Kim | ........................ | H05K 1/181 |
| 2018/0239096 A1 * | 8/2018 | Houbertz | ............. | G02B 6/4214 |
| 2018/0335589 A1 * | 11/2018 | Jou | ........................ | G02B 6/4259 |

(Continued)

*Primary Examiner* — Li Liu

(57) ABSTRACT

Integrated circuit chips may be optically interconnected using microLEDs. Some interconnections may be vertically-launched parallel optical links. Some interconnections may be planar-launched parallel optical links.

14 Claims, 39 Drawing Sheets

(56) References Cited

U.S. PATENT DOCUMENTS

| | | | |
|---|---|---|---|
| 2019/0207368 A1* | 7/2019 | Meister | G02B 6/4214 |
| 2019/0287908 A1* | 9/2019 | Dogiamis | H01P 3/121 |
| 2020/0386390 A1* | 12/2020 | Chen | F21S 4/24 |
| 2021/0096311 A1* | 4/2021 | Yu | G02B 6/12004 |

* cited by examiner

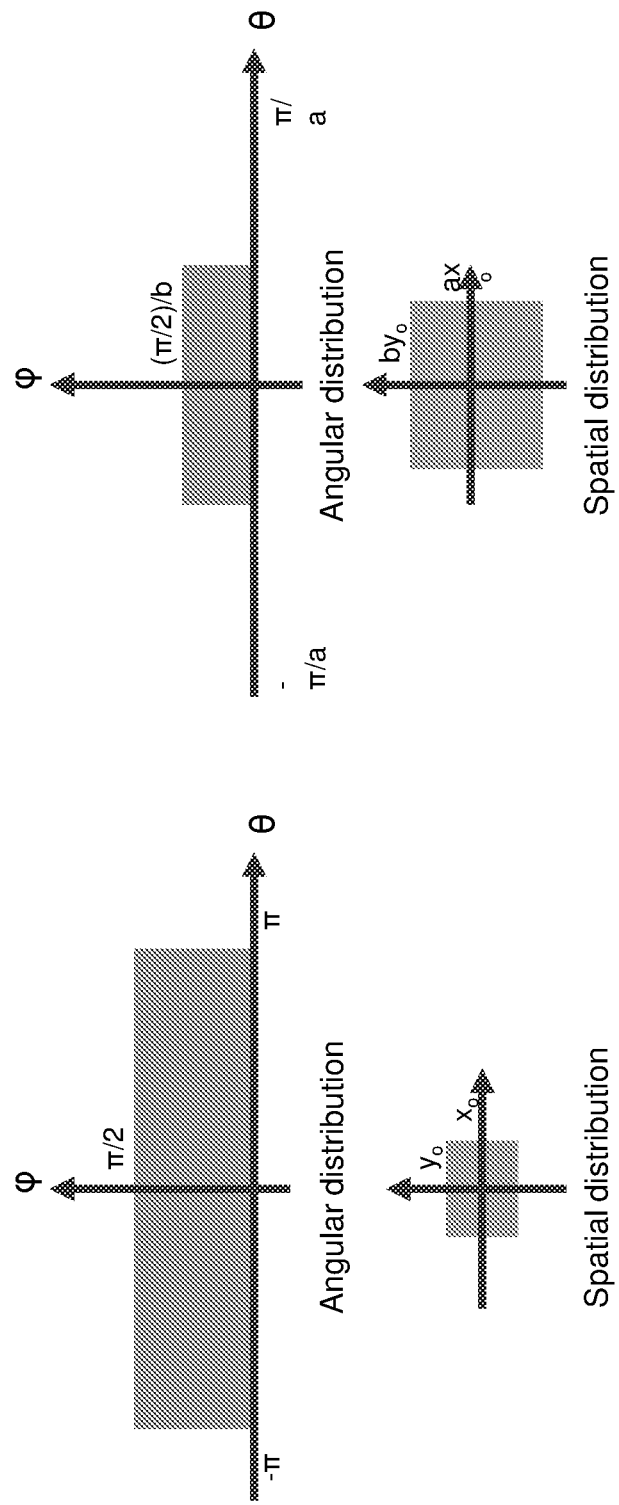

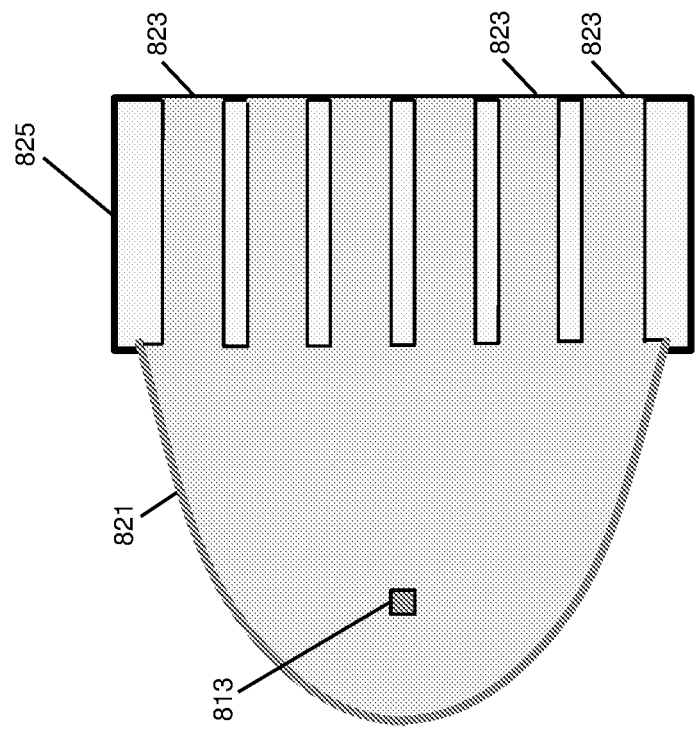
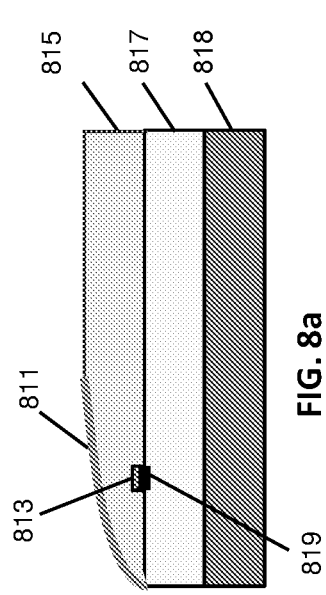
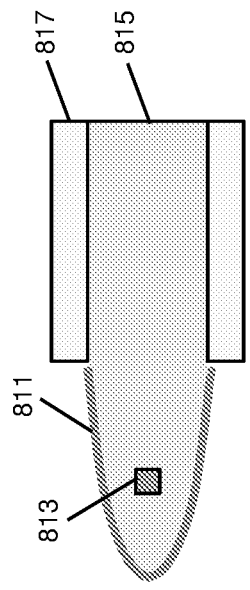
FIG. 8c
FIG. 8a
FIG. 8b

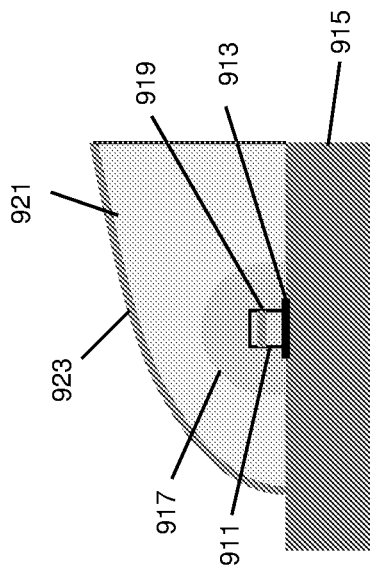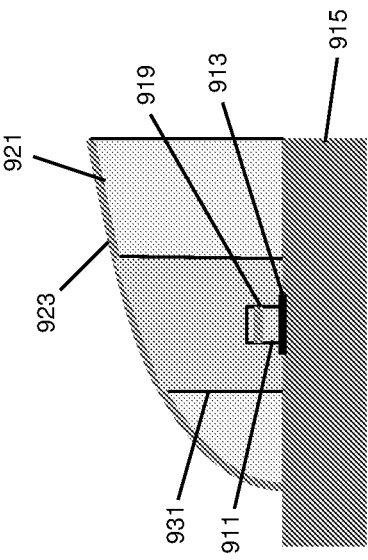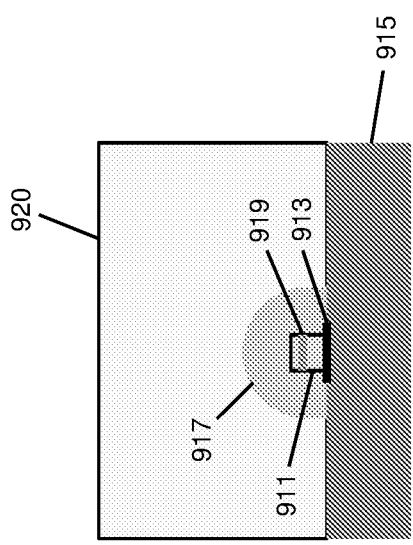

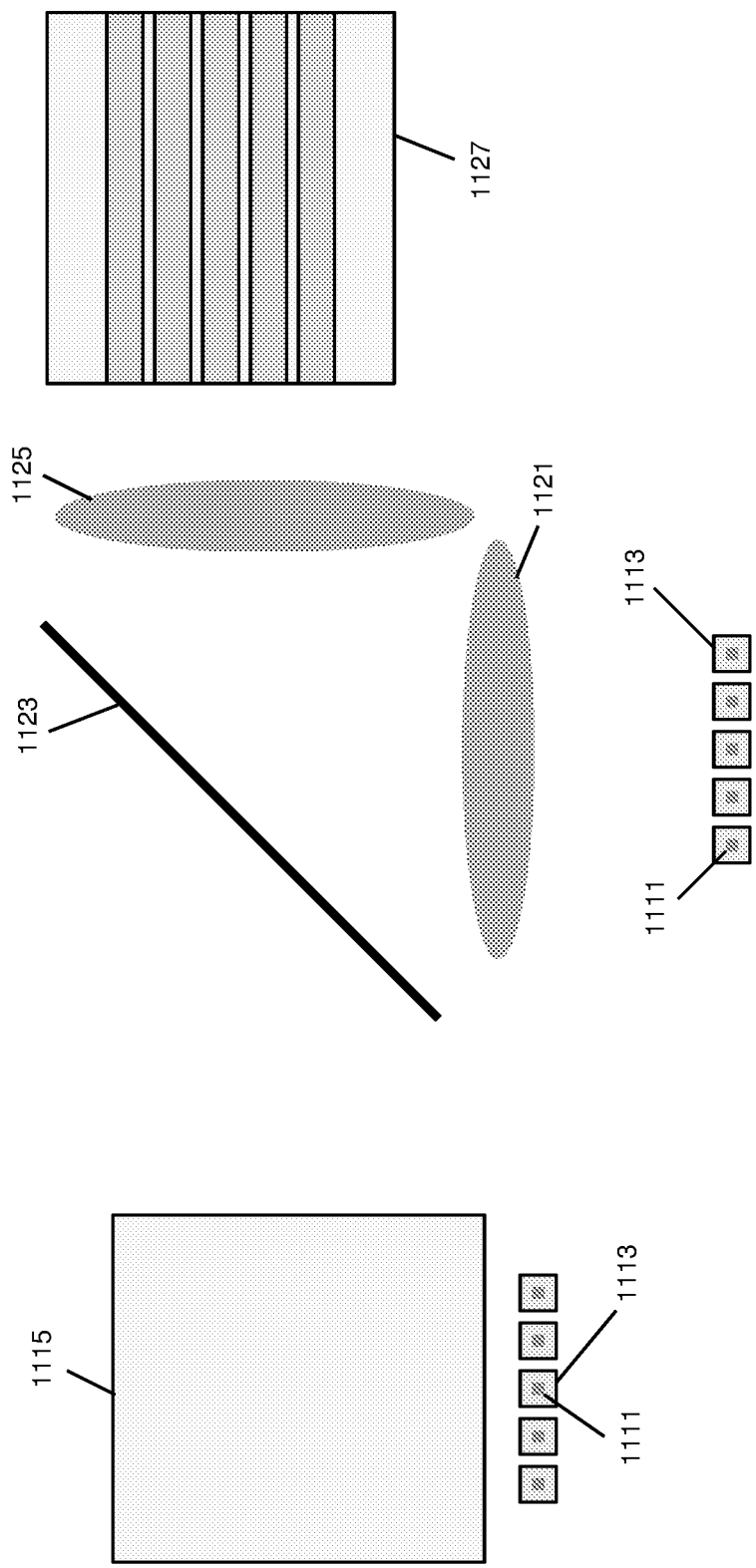

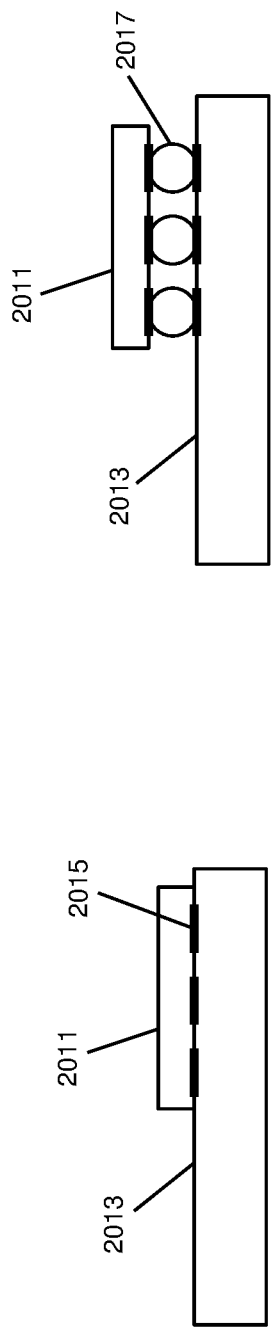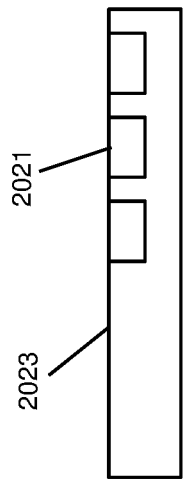

| Topology | Crossbar | Multistage Logarith. | Mesh |
|---|---|---|---|
| Direct/Indirect | Indirect | Indirect | Direct |
| Blocking/Non-blocking | Non-blocking | Blocking | Blocking |
| Cost | $O(N^2)$ | $O(N\log N)$ | $O(N)$ |
| Latency | $O(1)$ | $O(\log N)$ | $O(\sqrt{N})$ |

FIG. 32

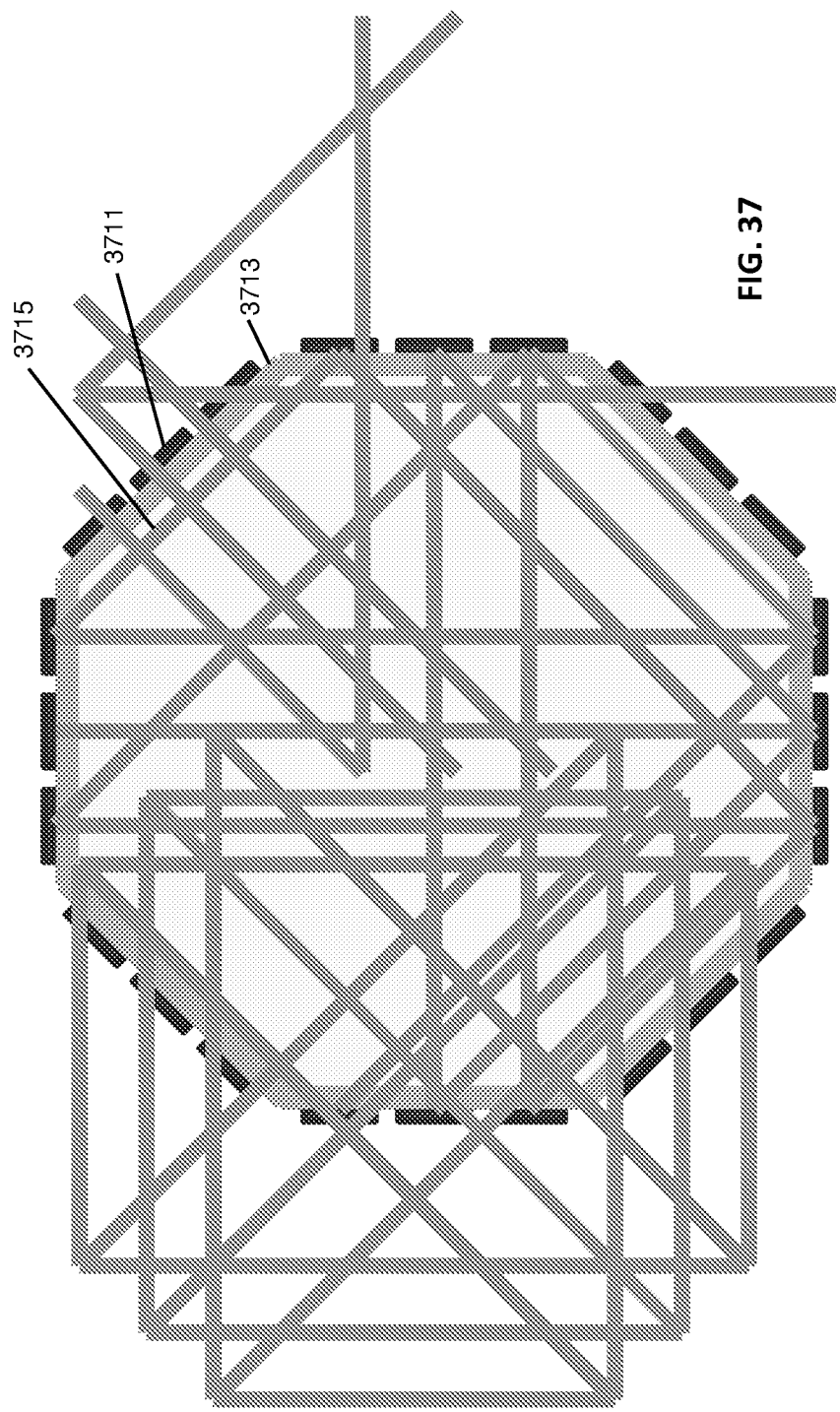

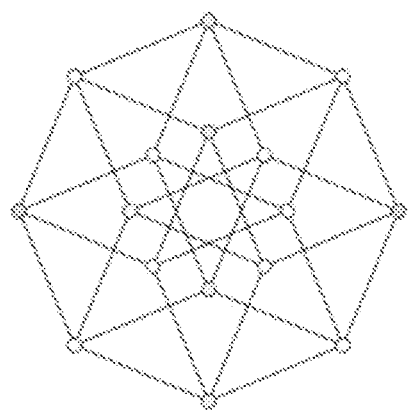
FIG. 38b
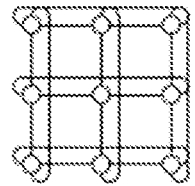
3-ary 2-cube
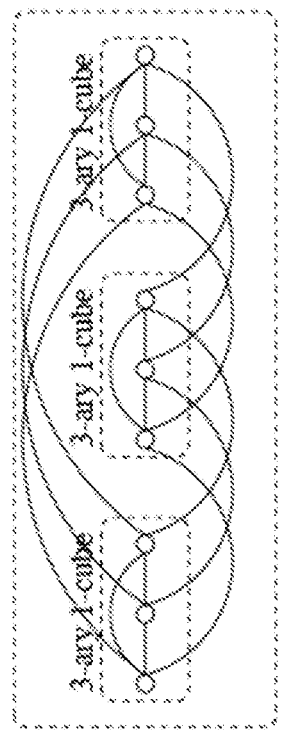
FIG. 38a

INTERCONNECT NETWORKS USING MICROLED-BASED OPTICAL LINKS

CROSS-REFERENCE TO RELATED APPLICATIONS

This application is a continuation of U.S. patent application Ser. No. 17/229,525, filed Apr. 13, 2021, which claims the benefit of the filing date of U.S. Provisional Patent Application No. 63/009,199, filed on Apr. 13, 2020, the disclosures of which are incorporated by reference herein.

BACKGROUND OF THE INVENTION

Demands for increased computing and networking performance are seemingly ubiquitous and never ending. Prominent applications include data center servers, high-performance computing clusters, artificial neural networks, and network switches.

For decades, dramatic integrated circuit (IC) performance and cost improvements were driven by shrinking transistor dimensions combined with increasing die sizes, summarized in the famous Moore's Law. Transistor counts in the billions have allowed consolidation onto a single system-on-a-chip (SoC) of functionality that was previously fragmented across multiple ICs.

However, the benefits of further transistor shrinks are decreasing dramatically as decreasing marginal performance benefits combine with decreased yields and increased per-transistor costs. Independent of these limitations, a single IC can only contain so much functionality, and that functionality is constrained because the IC's process cannot be simultaneously optimized for different functionality, e.g. logic, DRAM, and I/O.

In fact, there are significant benefits to "de-integrating" SoCs into smaller "chiplets", including:

The process for each chiplet can be optimized to its function, e.g. logic, DRAM, high-speed I/O, etc.

Chiplets are well-suited to reuse in multiple designs.

Chiplets are less expensive to design.

Chiplets have higher yield because they are smaller with fewer devices.

There is, however, a major drawback to chiplets compared to SoCs: use of chiplets generally requires far more chip-to-chip connections. Compared to the on-chip connections between functional blocks in SoCs, chip-to-chip connections are typically much less dense and require far more power (for example normalized as energy per bit).

BRIEF SUMMARY OF THE INVENTION

Some embodiments provide optical chip-to-chip interconnects with microLEDs as light sources. In some embodiments the interconnects have a linear connection density>10 Tbps/mm. In some embodiments the interconnects have an area interconnect density>1 Pbps/cm2. In some embodiments the interconnects have power consumption<1000/bit. In some embodiments the interconnects have an interconnect lengths>10 cm with no additional power dissipation. In some embodiments the interconnects have a latency approaching that limited by the speed of light.

In some embodiments the microLEDs are modulated at rates>1 Gbps. In some embodiments parallel optical links (POLs) include microLEDs as light sources. In some embodiments the parallel optical links provide interconnect networks for high-performance processing and networking applications.

Some embodiments provide optical interconnections for integrated circuit chips, comprising: a plurality of substrates; a plurality of integrated circuit chips on the plurality of substrates; a plurality of vertically launched parallel optical links (VLPOLs) optically interconnecting at least some of the integrated circuit chips; and a plurality of planar launched parallel optical links (PLPOLs) optically interconnecting at least some of the integrated circuit chips.

These and other aspects of the invention are more fully comprehended upon review of this disclosure.

BRIEF DESCRIPTION OF THE DRAWINGS

FIG. 1a shows the spatial and angular width of an LED of size xo×yo and an angular spectrum occupying $-\pi$ to $\pi$ radians in the $\theta$ direction and 0 to $\pi/2$ radians in the $\varphi$ direction (using spherical coordinates).

FIG. 1b shows that the $\theta$ and $\varphi$ ranges can be decreased.

FIGS. 8a and 8b show side and top views, respectively, of an embodiment which uses a parabolic reflector to efficiently capture light emitted vertically or laterally by an LED and couple the light into an output waveguide.

FIG. 8c shows a top view of a parabolic reflector used to couple light from an LED into a 1D array of output waveguides.

FIG. 9a shows an example of LED encapsulation.

FIG. 9b shows encapsulant interposed between the microLED and a waveguide medium.

FIG. 9c shows encapsulant as an approximately cylindrical column that continues up to a top of the waveguide.

FIG. 11a shows an array of microLEDs, each with its associated coupling assembly, coupled into a free-space propagation region.

FIG. 11b shows an example of free-space optical elements (FSOEs) of a free-space propagation region.

FIG. 20a shows a substrate with optoelectronic (OE) devices coupled to a transceiver IC by way of direct bonds, in accordance with aspects of the invention.

FIG. 20b shows a substrate with OE devices coupled to a transceiver IC by way of solder balls, in accordance with aspects of the invention.

FIG. 20c shows OE devices monolithically integrated into a transceiver IC, in accordance with aspects of the invention.

FIG. 32 compares mesh, multi-stage logarithmic, and crosspoint networks as a function of the number of interconnected nodes.

FIG. 37 shows ICs mounted to substrates located around the periphery of a 3D shape and interconnected by VLPOLs through an interior of that shape.

FIG. 38a shows a 3-ary 2-cube network.

FIG. 38b shows a 4D hypercube.

DETAILED DESCRIPTION

Figure 2C:
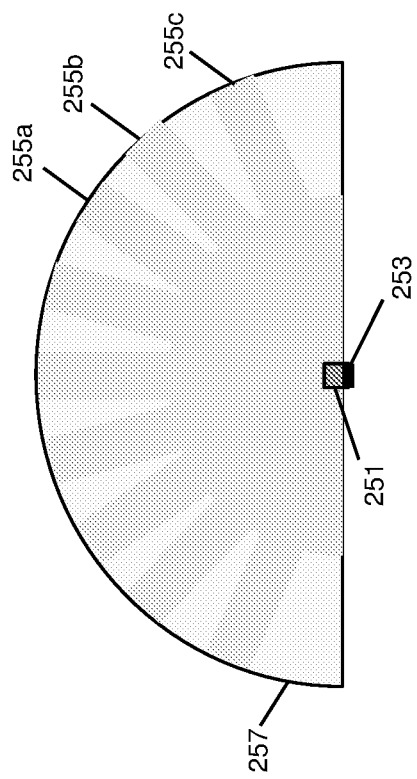
FIG. 2c shows an example implementation of division of angular spectrum of an LED into multiple waveguides.

In some embodiments parallel optical links (POLs) use microLED sources and photodetectors, which may be collectively referred to as optoelectronic (OE) devices. POLs provide highly parallel, low latency point-to-point connectivity. Some embodiments may also or instead provide for point-to-multipoint connectivity.

A microLED is made from a p-n junction of a direct-bandgap semiconductor material. A microLED is distinguished from a semiconductor laser (SL) in the following ways: (1) a microLED does not have an optical resonator structure; (2) the optical output from a microLED is almost completely spontaneous emission whereas the output from a SL is dominantly stimulated emission; (3) the optical output from a microLED is temporally and spatially incoherent whereas the output from a SL has significant temporal and spatial coherence; (4) a microLED is usually designed to be operated down to a zero minimum current, whereas a SL is designed to be operated above a minimum threshold current, which is typically at least 1 mA.

A microLED may be distinguished from a standard LED by having an emitting region of equal to or less than 20 μm×20 μm. MicroLEDs generally have small etendue, allowing them to be efficiently coupled into small waveguides and/or imaged onto small photodetectors. For convenience, the following discussion will generally mention LEDs. It should be recognized, however, that the discussion pertains to microLEDs, which may be considered a particular type of LED.

LEDs emit in a Lambertian pattern; light is emitted into a full half-sphere of $2\pi$ steradians. This wide angular spectrum is poorly matched to the limited numerical aperture (NA) of a waveguide. A challenge in coupling a microLED to a small waveguide is to address this NA mismatch.

The product of the spatial and angular aperture of an LED is captured in its etendue. The etendue of an LED generally cannot be reduced; generally it can only be preserved or increased. This implies, for instance, that the coupling from an LED to a single-mode waveguide is very low, since a single-mode waveguide has a very low etendue.

FIG. 1a shows the spatial and angular width of an LED of size $x_o \times y_o$ and an angular spectrum occupying $-\pi$ to $\pi$ radians in the $\theta$ direction and 0 to $\pi/2$ radians in the $\varphi$ direction (using spherical coordinates). Through the use of curved optical surfaces, whether refractive (e.g., a lens) or reflective (e.g. a curved mirror), the spatial and angular distribution widths of an LED can be traded off. FIG. 1B shows that the $\theta$ and $\varphi$ ranges can be decreased by factors of a and b, respectively, at the expense of increasing the x and y spatial width by factors of a and b, respectively (a>1, b>1).

The ability to reduce angular width by increasing spatial width is especially powerful for very small microLEDs. For instance, light from a 1 µm×1 µm microLED can be efficiently coupled to a 4 µm×4 µm waveguide with an NA of 0.25 (which is quite practical for a multimode waveguide) if appropriate curved optical elements are used. This is discussed below.

Figure 2A:
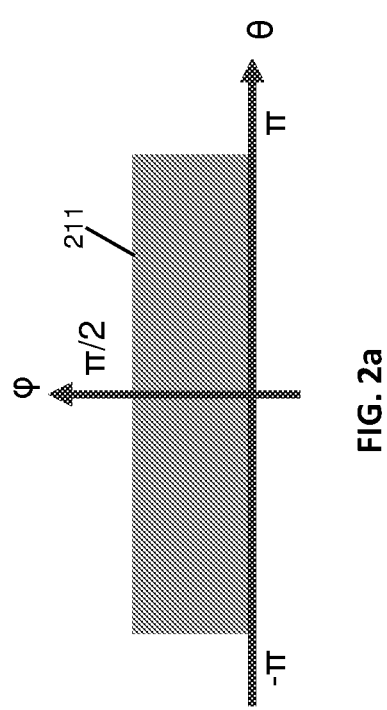
FIG. 2a shows the angular spectrum of an LED.
Figure 2B:
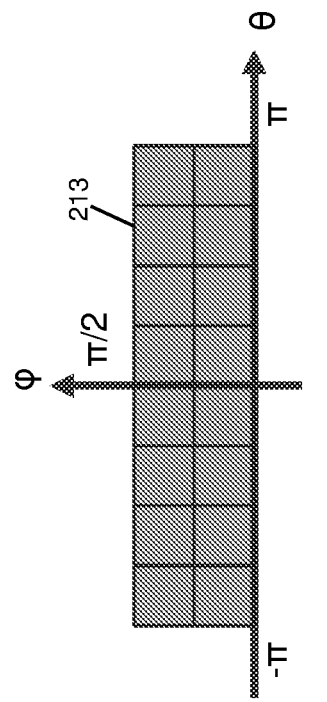
FIG. 2b shows the angular spectrum of the LED divided into smaller regions.

It can be useful to launch light from an LED into multiple output waveguides. This allows a signal modulated on the LED to be broadcast to multiple destinations, which is useful in many processing architectures. The broad angular spectrum of an LED is well-suited to this broadcast functionality. FIG. 2a shows the angular spectrum 211 of an LED. FIG. 2b shows that the angular spectrum of an LED can be divided into smaller regions, for example a region 213, each of which has an angular spectrum that is well-matched to the characteristics of an output waveguide. FIG. 2c shows how this can be implemented with a 1-dimensional (1D) or 2-dimensional (2D) array of output waveguides. In FIG. 2c, a microLED 251 has a bottom reflector 253 to assist in directing light generally towards multiple waveguides, for example waveguide cores 255a-c. The waveguide cores are surrounded by cladding 257. In the 2D case, the second dimension of the output waveguide array is into the page.

Figure 3C:
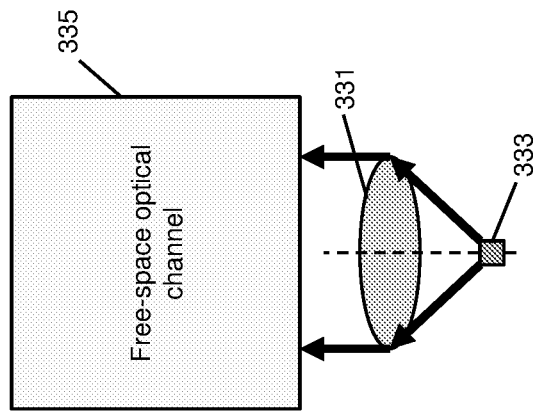
FIG. 3c shows the use of a lens to couple light from an LED into a free-space propagation region.
Figure 3B:
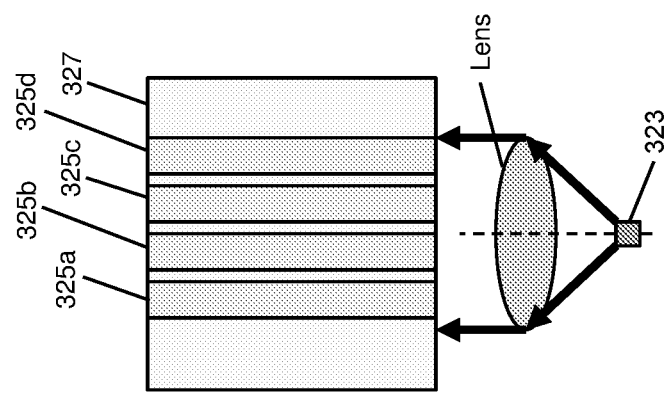
FIG. 3b shows the use of a lens to couple light from an LED to a 2D array of waveguides.
Figure 3A:
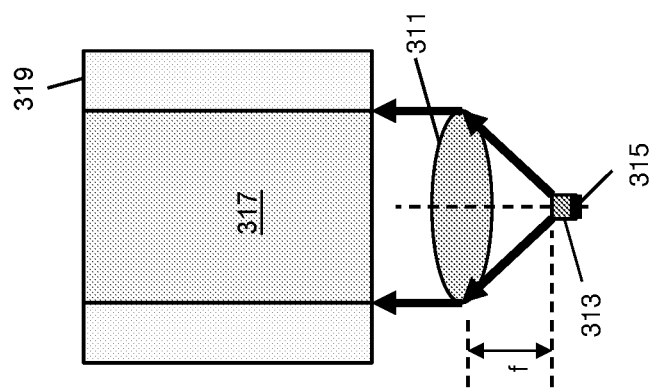
FIG. 3a shows the use of a lens to couple light from an LED to a waveguide.

FIG. 3a shows the use of a lens 311 to couple light from an LED to a waveguide, with FIG. 3a showing a microLED 313 and the waveguide as having a waveguide core 317 surrounded by waveguide cladding 319. A bottom reflector 315 is on a bottom of the microLED, away from the lens, to assist in directing light towards the lens. The lens is used to trade off the angular and spatial width of the LED's emission. If the lens diameter is larger than that of the LED, and for example located approximately one focal length from the LED, all as illustrated in FIG. 3a, the angular spectrum at the output of the lens is significantly decreased from that at the lens input and can be efficiently coupled to a waveguide matched to the diameter and NA of the output light from the lens.

FIG. 3b shows the use of a lens 321 to couple light from an LED, a microLED 323 as illustrated in FIG. 3b, to a 2D array of waveguides. The array of waveguides include a plurality of parallel waveguide cores 325a-d, surrounded by waveguide cladding 327. If the spacing between waveguides is small compared to the core diameter, most of the light at the lens output will be coupled into the waveguides. For a lens of a given diameter, the waveguides can be smaller compared to the single output waveguide case. The intensity at the center generally will be somewhat higher than that at the edges. If desired, the center waveguide can be made narrower than the waveguides at the edges to equalize the power coupled into each waveguide.

FIG. 3c shows the use of a lens 331 to couple light from an LED, a microLED 333 in FIG. 3c, into a free-space propagation region 335. Such a region may contain a variety of refractive, reflective, and absorptive elements including lenses, holographic optical elements, and mirrors.

Figure 4C:
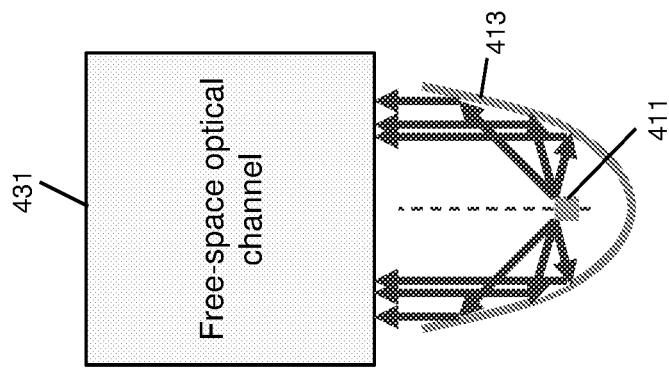
FIG. 4c shows a parabolic reflector used to couple light from an LED into a free-space propagation region.

Practical lenses with f-numbers much less than 1 are generally difficult to realize. This implies that the lenses in FIGS. 3a-c may fail to capture a large amount of the LEDs output power. FIG. 4a shows the use of a parabolic reflector to efficiently capture light emitted at large angles from the LED and couple it into an output waveguide. FIG. 4a shows a microLED 411 at approximately a focus of a parabolic reflector 413. The microLED has a reflector 415 at its bottom, with a top of the microLED facing a waveguide comprised of a waveguide core 417 surrounded by waveguide cladding 419. Note that, depending on the LED design, the LED may emit significant lateral light from edge emission as well as vertical light from surface emission, and the parabolic reflector captures both of these well. As the parabola is made deeper and deeper, the angular spectrum of the output light is decreased while the size of the output optical distribution increases, which is the expected trade-off. To produce an output angular spectrum that can be efficiently coupled to a waveguide with an NA of <0.3, the parabola may get quite deep.

Figure 4B:
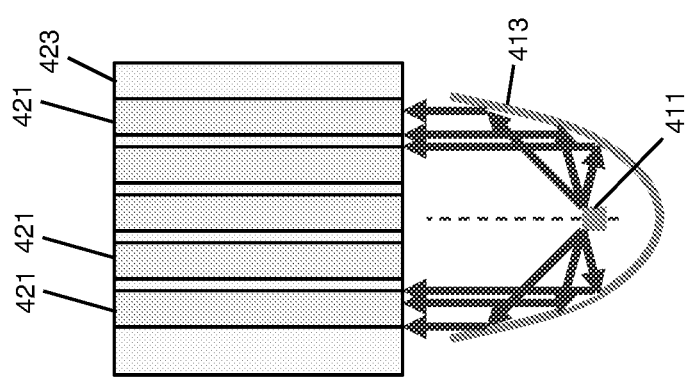
FIG. 4b shows a parabolic reflector used to couple light from an LED into a 2D array of output waveguides.
Figure 4A:
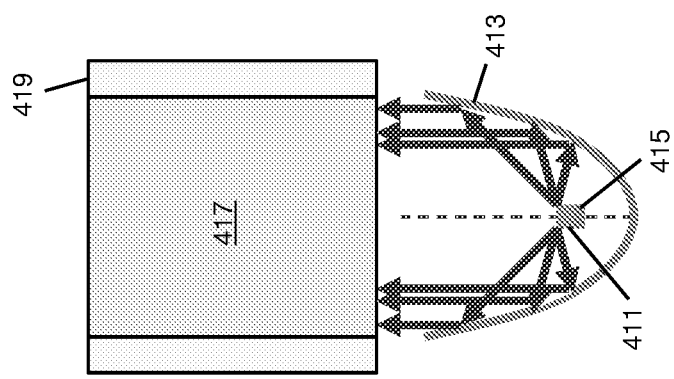
FIG. 4a shows the use of a parabolic reflector to efficiently capture light emitted at large angles from the LED and couple it into an output waveguide.

FIG. 4b shows a parabolic reflector used to couple light from an LED into a 2D array of output waveguides. FIG. 4b is similar to FIG. 4a, with the microLED 411 at about a focus of the parabolic reflector 413. Compared to FIG. 4a, however, FIG. 4b includes a plurality of waveguide cores 421 surrounded by waveguide cladding 423, instead of a single waveguide core surrounded by waveguide cladding. The intensity distribution at the waveguide inputs is a bit complicated because there is overlap of reflected and unreflected rays. There is also a contribution from the lateral emission. The power into each waveguide can be equalized by varying the waveguide area in inverse proportion to the optical intensity at its input.

FIG. 4c shows a parabolic reflector 413 used to couple light from an LED, for example the microLED 413 into a free-space propagation region 431. Such a region may contain a variety of refractive, reflective, and absorptive elements including lenses, holographic optical elements, and mirrors.

Figure 5C:
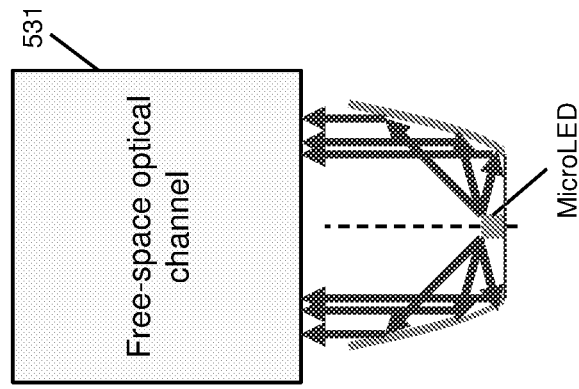
FIG. 5c shows a truncated parabolic reflector used to couple light from an LED into a free-space propagation region.

If the lateral emission from the LED is small (or the LED is oriented such that emission is small in directions normal to propagation direction from the LED to the waveguide), there may be reduced or no need for the bottom part of the parabolic reflector because light is not substantially emitted at angles beyond the LED surface parallel (assuming the LED has a rear reflector). FIG. 5a shows a truncated parabolic reflector where an LED sits in a flat truncated bottom area of the reflector. In FIG. 5a, the LED is a microLED 511. Walls of the truncated parabolic reflector 513 extend upward from about a bottom surface of the microLED. A multicore waveguide, with multiple waveguide cores 515 surrounded by waveguide cladding 517, is above the microLED. The use of a truncated parabolic reflector may simplify fabrication and assembly compared to use of the full parabolic reflector.

Figure 5B:
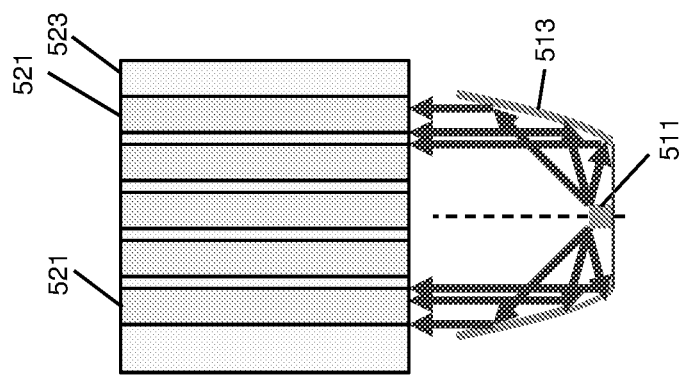
FIG. 5b shows a truncated parabolic reflector used to couple light from an LED into a 2D array of output waveguides.
Figure 5A:
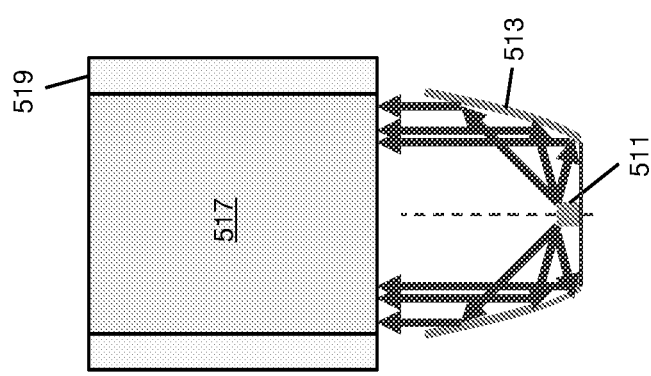
FIG. 5a shows a truncated parabolic reflector where an LED sits in a flat truncated bottom area of the reflector.

FIG. 5b shows a truncated parabolic reflector used to couple light from an LED into a 2D array of output waveguides. In FIG. 5b, the microLED 511 is at about a base of the truncated parabolic reflector 513. A multicore waveguide, with multiple waveguide cores 521 surrounded by waveguide cladding 523, is above the microLED. As is the case with lens-based coupling, the intensity in the center will tend to be higher than at the edges. If desired, the center waveguide can be made narrower than the waveguides at the edges to equalize the power coupled into each waveguide.

FIG. 5c shows a truncated parabolic reflector used to couple light from an LED into a free-space propagation region. FIG. 5c also shows the microLED 511 at about a base of the truncated parabolic reflector 513. A free-space propagation region 531 is above the microLED and truncated parabolic reflector. The free-space propagation region may contain a variety of refractive, reflective, and absorptive elements including lenses, holographic optical elements, and mirrors.

Figure 6C:
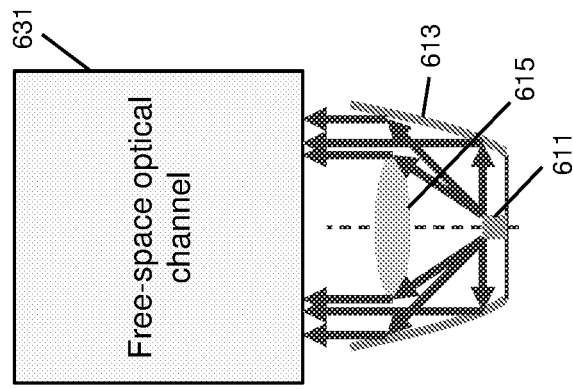
FIG. 6c shows a hybrid lens—truncated parabolic reflector used to couple light from an LED into a free-space propagation region.

To reduce otherwise desired depth of the parabolic reflector, for example in order to make its fabrication more practical, a lens and parabolic reflector can be used together in a hybrid assembly. FIG. 6a shows a microLED 611 at a base of a truncated parabolic reflector 613, with a lens 615 between the microLED and a waveguide above the microLED and reflector. The waveguide includes a waveguide core 617 surrounded by waveguide cladding 619. Rays closer to the LED surface normal are bent by the lens, while those at angles exceeding the lens's NA are reflected by the parabola. This hybrid approach provides very high potential coupling efficiency to a waveguide while requiring much less depth in the parabolic reflectors.

Figure 6B:
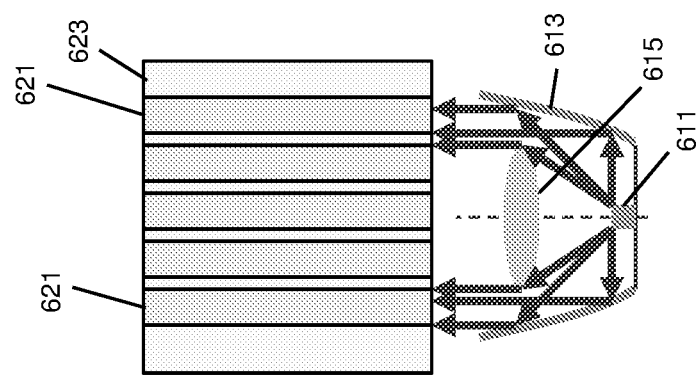
FIG. 6b shows a hybrid lens—truncated parabolic reflector used to couple light from an LED into a 2D array of output waveguides.
Figure 6A:
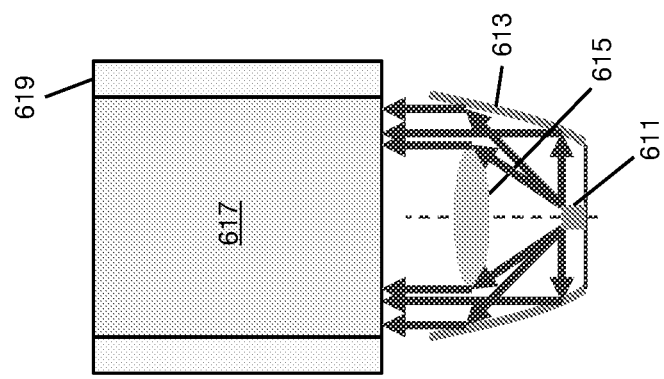
FIG. 6a shows a microLED at a base of a truncated parabolic reflector, with a lens between the microLED and a waveguide above the microLED and reflector.

FIG. 6b shows a hybrid lens—truncated parabolic reflector used to couple light from an LED into a 2D array of output waveguides. In FIG. 6b, the arrangement of the microLED 611, truncated parabolic reflector 613 and lens 615 is as discussed with respect to FIG. 6a. The embodiment of FIG. 6b, however, replaces the waveguide with a multi-core waveguide, having a plurality of waveguide cores 621 surrounded by waveguide cladding 623. As is the case with lens-based coupling, the intensity in the center will tend to be higher than at the edges. If desired, the center waveguide can be made narrower than the waveguides at the edges to equalize the power coupled into each waveguide.

FIG. 6c shows the hybrid lens—truncated parabolic reflector used to couple light from an LED, which may be the microLED 611, into a free-space propagation region 631. Such a region may contain a variety of refractive, reflective, and absorptive elements including lenses, holographic optical elements, and mirrors.

Figure 7C:
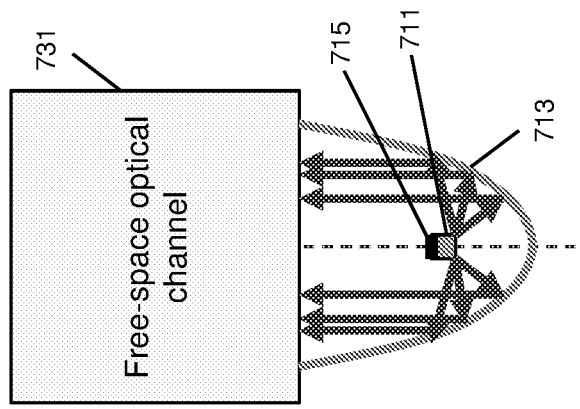
FIG. 7c shows the inverted LED with a parabolic reflector of FIG. 7a used to couple light from an LED into a free-space propagation region.
Figure 7B:
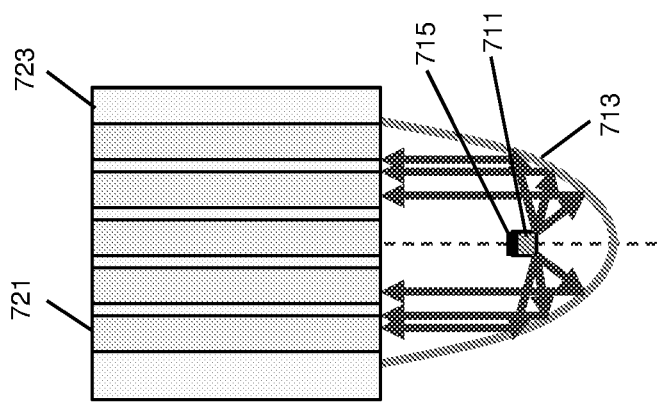
FIG. 7b shows the inverted LED with a parabolic reflector of FIG. 7a coupling to a 2D array of waveguides.
Figure 7A:
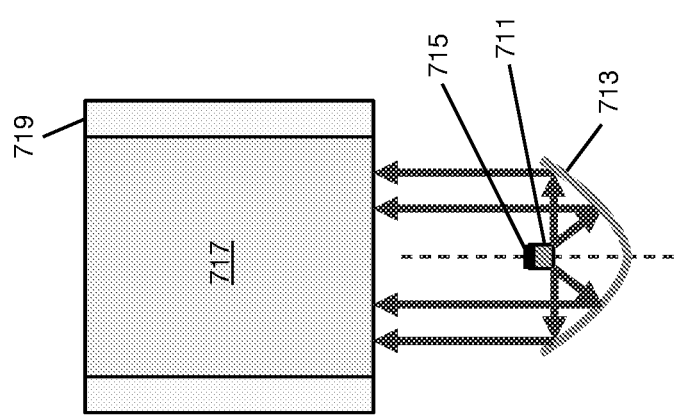
FIG. 7a shows an LED facing down toward the trough of a parabolic reflector.

FIG. 7a shows an LED, which may be a microLED 711, facing down toward the trough of a parabolic reflector 713. In other words, primarily light is emitted from the LED towards the trough, and the LED may have a reflector 715 on a side away from the trough. In FIG. 7a, light is reflected from the parabolic reflector towards a waveguide core 717, which is surrounded by waveguide cladding 719. This approach may use a parabola of only modest depth and can capture the LED's light very efficiently. Some of the light reflected by the parabola is occluded by the LED, but if the beam size is being significantly expanded then the associated occlusion loss can be quite small. For instance, if the light is expanded 4× in each transverse dimension then the occlusion loss can be in the range of 1/16 (0.3 dB) of the optical power. The optical power distribution will be similar to that from a lens, with the exception that the very center will be notched out by the shadow of the LED.

FIG. 7b shows the inverted LED with a parabolic reflector of FIG. 7a coupling to a 2D array of waveguides. The array of waveguides is shown in FIG. 7b as including a plurality of waveguide cores 721 surrounded by waveguide cladding 723. If the spacing between waveguides is small compared to the core diameter, most of the light at the lens output will be coupled into the waveguides. For a given parabola size, the waveguides can be smaller compared to the single output waveguide case. The intensity of light at the very center will be notched out by the shadow of the LED, but beyond that shadow, the intensity closer to the center will be higher than that at the edges. If desired, the waveguide areas can be varied in inverse proportion to the intensity at their inputs to equalize the power coupled into each waveguide.

FIG. 7c shows the inverted LED with a parabolic reflector of FIG. 7a used to couple light from an LED into a free-space propagation region 731. Such a region may contain a variety of refractive, reflective, and absorptive elements including lenses, holographic optical elements, and mirrors.

FIGS. 8a and 8b show side and top views, respectively, of an embodiment which uses a parabolic reflector 811 to efficiently capture light emitted vertically or laterally by an LED, which may be a microLED 813, and couple the light into an output waveguide. In the embodiment of FIGS. 8a and 8b, the microLED is in a waveguide core 815, both of which are on waveguide cladding 817, with the waveguide cladding also being on sides of the waveguide core. The waveguide cladding is shown on a substrate 818 A bottom reflector 819 is on a bottom of the microLED. The microLED is placed near an end of the waveguide core, with the parabolic reflector on top of a correspondingly shaped end of the waveguide core. The horizontal and vertical curvature of the reflector can be different to accommodate a waveguide with different height and width. The horizontal curvature can be defined using two-dimensional lithographic methods, while the vertical curvature can be defined by thermal reflow, by multi-layer two-dimensional lithography, or by three-dimensional lithography.

As shown in FIG. 8a,b, the LED can be embedded in the waveguide itself. This provides the benefit of encapsulating the LED in a high-index medium, which significantly improves light extraction efficiency (LEE) from the LED.

LED contacts could be formed prior to fabricating the waveguide or afterwards by tracing over the waveguide sidewall and contacting the LED through a via, using either reflective or transparent conductive materials.

FIG. 8c shows a corresponding top view of a parabolic reflector 821 used to couple light from an LED, which may be the microLED 813, into a 1D array of output waveguides The array of output waveguides includes a plurality of waveguide cores 823 surrounded by waveguide cladding 825. The intensity distribution at the waveguide inputs is somewhat complicated because there is overlap of reflected and unreflected rays. There is also a contribution from the lateral emission. The power into each waveguide can be equalized by varying the waveguide area in inverse proportion to the optical intensity at its input.

LEDs are made from high-index materials (n>2.5) and emit light into a very large angular cone. When emitting into an external low-index medium such as air, this causes much of the light emanating from the LED's active layer to experience total internal reflection (TIR) at the LED-external medium interface and thus not be available to the external system; the fraction of emitted light that can be externally extracted is the light extraction efficiency (LEE).

There are numerous techniques for reducing TIR and thus increasing LEE, including roughening the LED surface and utilizing novel LED shapes. One of the most effective techniques for increasing LEE may be encapsulation of the LED in a high-index medium, referred to as an encapsulant. While the encapsulant index would ideally match that of the LED, an encapsulant simply may have an index significantly higher than that of the external medium. For instance, if the external medium is air with an index of n=1, an encapsulant with an index of 1.5 will significantly increase LEE.

Note that the encapsulant does not provide TIR reduction benefits if the encapsulant-external medium interfaces are parallel to the LED-encapsulant interfaces. Rather, the encapsulant-external medium interface is ideally a spherical surface centered on the LED's active area. FIG. 9a shows an LED 911 with a rear reflector/contact 913 on a substrate 915. An encapsulant 917 also on the substrate encapsulates the LED. An outer edge of the encapsulant includes a rounded top, and is roughly equidistant from an active layer 919 of the LED. An air or other low index medium 920 is about the encapsulant.

This encapsulation technique can be applied to all of the microLED coupling schemes discussed above. This includes the planar waveguide scheme of FIGS. 8a-c, where the microLED is encased in the waveguide. In that case, as somewhat shown in FIG. 9b, the encapsulant is interposed between the microLED and waveguide medium. FIG. 9b shows a side view in which the LED 911 with a rear reflector/contact 913 is on a substrate 915. An encapsulant 917 also on the substrate encapsulates the LED. An outer edge of the encapsulant includes a rounded top, and is roughly equidistant from an active layer 919 of the LED. The encapsulant is in a waveguide medium 921, which has a parabolic-shaped end, in which the LED is located. A parabolic reflector 923 is over the parabolic-shaped end of the waveguide medium.

This has the ancillary benefit of mechanically isolating the LED from any stress in the waveguide medium. For instance, in some embodiments a polymer encapsulant can be used to isolate the LED from a high-stress oxide waveguide.

For the waveguide example of FIGS. 8a-c, the encapsulant can also be an approximately cylindrical column 931 that continues up to the top of the waveguide, as shown in FIG. 9c. If the top of the waveguide is part of a parabolic reflector, the reflection from that top surface will be approximately parallel to the encapsulant-waveguide medium interface and the reflections at that interface will be minimized.

Various technologies can be used to implement the foregoing schemes. In some embodiments the waveguides and lens could be made of a combination of polymer, oxide, nitride, or other inorganic materials. Lens geometry could be controlled by thermal reflow, by multi-layer two-dimensional lithography, or by three-dimensional lithography.

A deep parabolic structure is used in some of the foregoing schemes. Such a deep structure with a controlled sidewall curvature could be obtained by a combination of anisotropic and isotropic etching steps. For example, on a silicon substrate, or its oxide, the deep parabolic shape could be obtained by a combination of dry deep reactive-ion (DRIE), wet potassium hydroxide (KOH), hydrofluoric acid-based wet etching. The trench could be filled to the appropriate height by the transparent cladding material upon which an LED would be placed. The LED and trench could be filled with the cladding material to provide a robust surface upon which to produce a lens or other structure.

Figure 10B:
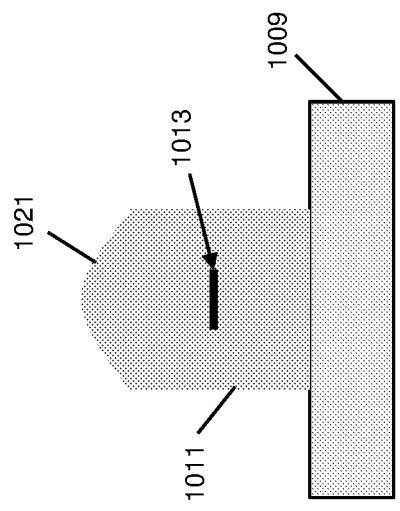
FIG. 10b shows a lens formed on the end of a microLED.
Figure 10C:
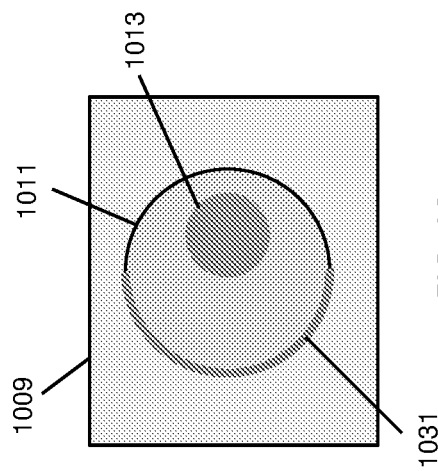
FIG. 10c shows a top view of a microLED mounted on a substrate, with a curved reflector on the side of the LED.
Figure 10A:
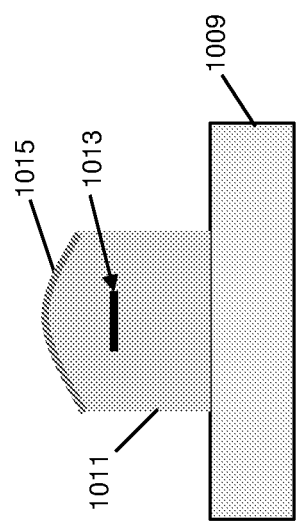
FIG. 10a shows a curved reflector formed on one end of a microLED.

Reflectors and lenses can be formed on the LEDs themselves. These techniques are generally most useful if the active layer region of the LED does not extend all the way to the edge of the device. FIG. 10a shows a curved reflector formed on one end of a microLED. The microLED is on a substrate 1009. The microLED includes a body 1011, with an active layer 1013 in the body. The curved reflector 1015 is on a curved end surface of the body, concave towards the active layer. This can be used to reduce the angular spread of the light from the LED and reflect it back through a transparent substrate. FIG. 10b shows an embodiment similar to that of FIG. 10a, except a lens 1021 is formed on the end of a microLED in place of the curved reflector. Use of the lens can reduce the angular spread of the light emitted by the LED. FIG. 10c shows a top view of a microLED mounted on a substrate. A curved reflector 1031 is fabricated on a side of the LED, which collects light emitted toward the reflector and reflects it forward with a reduced angular spread.

A single free-space optical element (FSOE) can operate on a large array of optical signals. FSOEs elements can be refractive, diffractive, and absorptive. Prominent examples of FSOEs include lenses, mirrors, gratings, and holographic optical elements. FIG. 11a shows an array of microLEDs 1111, each with its associated coupling assembly 1113, coupled into a free-space propagation region 1115, which may include free-space optics. The microLED coupling assembly may exploit any of the schemes enumerated above.

FIG. 11b shows a simple example of the free-space optical elements (FSOEs) that might make up a free-space propagation region. In FIG. 11b, light from an array of microLED coupling assemblies 1113 propagates, in sequence, to a lens 1121 that spans the entire array, a turning mirror 1123, and another lens 1125 that images the light from the entire microLED array onto a multi-waveguide array 1127. Examples of multi-waveguide arrays include multicore fibers, coherent imaging fibers, and multi-layer planar waveguide arrays.

In some embodiments the various arrangements including microLEDs is used in systems providing optical communications between chips and/or chiplets. In some embodiments, for example, the arrangements may be utilized in conjunction with an integrated circuit (IC).

Some embodiments couple light from a microLED transmitter array to an array of transmission channels, preferably with low loss. Each microLED in the transmitter array emits light into a wide angular distribution. By contrast, each transmission channel typically accepts and carries a much smaller angular distribution; the angular acceptance range of an optical channel is often expressed as its numerical aperture (NA).

Some embodiments use one or more methods or techniques to efficiently couple the light from the large angular distribution of the microLED to the smaller angular acceptance distribution of the transmission channel. Some embodiments utilize an optical system that magnifies the image of the entire microLED array onto the input of the transmission channels, increasing the image size of each microLED while reducing its angular range. Other embodiments magnify the emission area from each microLED separately. In some embodiments these methods may be employed separately in a light coupling system, while in some embodiments they may both be used together.

Figure 12:
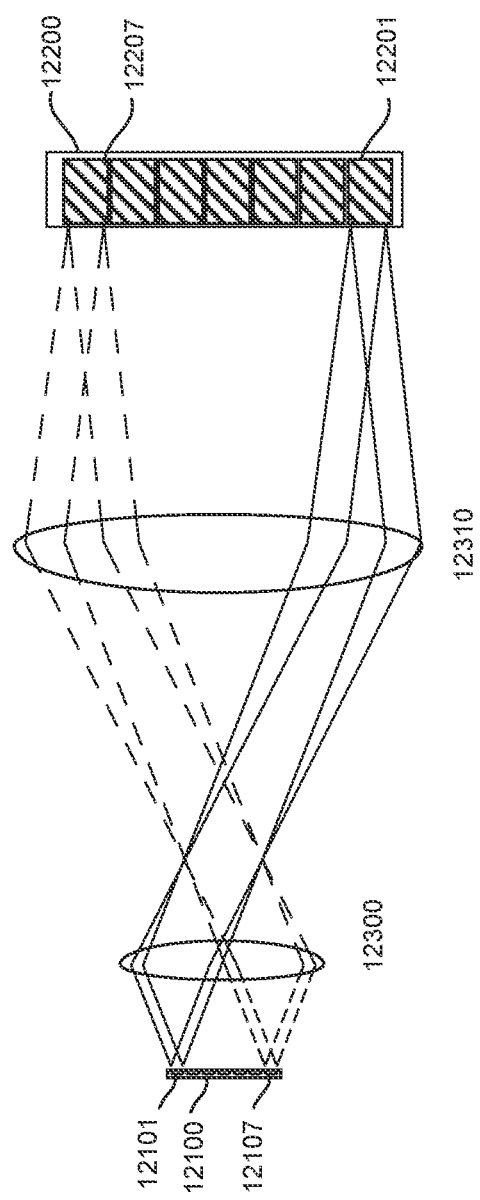
FIG. 12 shows a magnifying system that expands the light from emitters to optical transmission channels and reduces the angular range of the light in each channel.

FIG. 12 shows a magnifying system that expands the light from emitters to optical transmission channels and reduces the angular range of the light in each channel. A first lens 12300 collimates light from a microLED transmitter array 12100. A longer focal length lens 12310 focuses the collimated light onto optical transmission channel inputs 12200. FIG. 12 also shows the rays as solid lines coupling light from emitter element 12101 of the microLED transmitter array to optical transmission channel input 12201 of the transmission channel inputs. Similarly, optical rays coupling emitter element 12107 of the microLED transmitter array to transmission channel input 12207 of the transmission channel inputs are shown as dashed lines. The magnifying system also couples light from the intermediate microLEDs of the transmission channel inputs to intermediate optical channels of the microLED transmitter array.

The rays shown represent an angular bundle of rays from the edges of the emitter element imaged onto the edges of the transmission channel. Rays from the center regions of the emitter element travel in similar paths.

Figure 13:
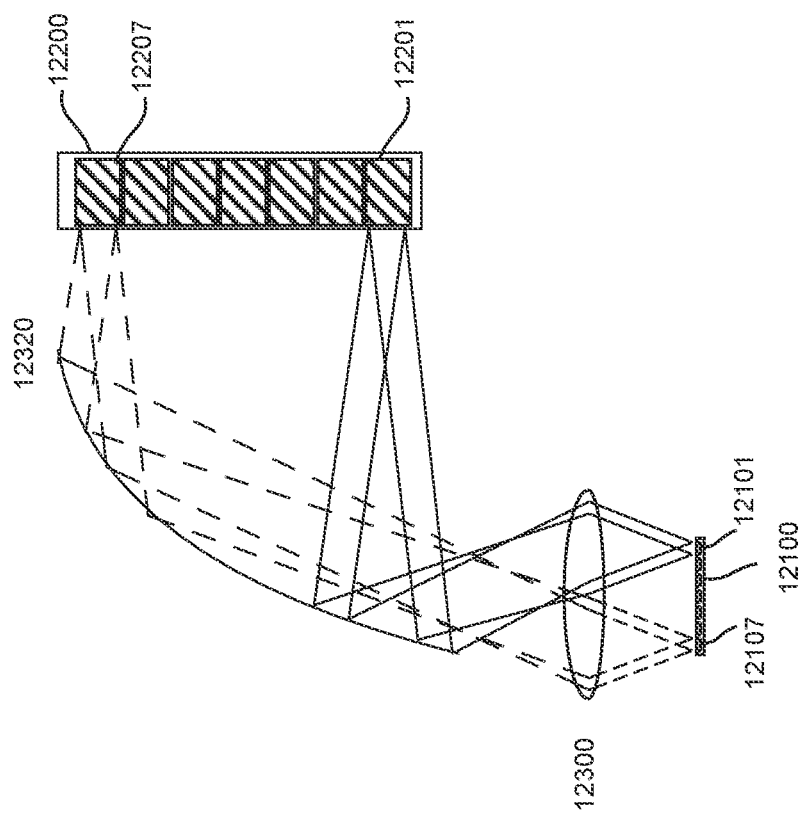
FIG. 13 shows a system for carrying light from a microLED transmitter array to optical transmission channel inputs, with the system including a folding mirror.

FIG. 13 shows a system for carrying light from the microLED transmitter array, 12100 to the optical transmission channel inputs 12200, with the system including a folding mirror 12320. In system of FIG. 13 the folding mirror is curved and replaces the second lens 12310 of FIG. 12. In FIG. 13 light from the emitters of the microLED transmitter array is collimated by the first lens 12300, with the collimated light reflected by the folding mirror to the optical transmission channel inputs 12200. The curved folding mirror serves both to refocus the light onto the optical transmission channel inputs 12200 as well as fold the optical train by 90° to couple light from the microLEDs, that are shown as emitting light vertically to the optical transmission channels, that are shown as transmitting the light horizontally.

Instead of replacing one of the lenses in FIG. 12 with a curved mirror, in some embodiments a planar mirror is placed between the two lenses of FIG. 12 to fold light of the system. The simple lenses shown in FIGS. 12 and 13 could also be compound lenses with a number of powered surfaces. In general, any imaging system that magnifies the image of the microLED array also reduces the range of angles incident on the optical channel array, enabling low loss coupling to an optical channel array that has a limited input optical acceptance angle.

In some embodiments the individual microLEDs in an array may each have light collection optics which transmit the emission preferentially towards one direction for further transmission in an optical channel. These light collection optics can be imaging lenses, parabolic reflectors, or non-imaging devices such as described in U.S. Pat. Nos. 5,271,077, 4,257,672 and 4,767,172, the disclosures of which are incorporated by reference herein. In some embodiments the design of non-imaging light collection systems may be optimized for collecting light into uniform optical channels such as step index multimode fiber cores or for optical channels whose angular acceptance depends on position, such as graded index fiber cores.

Figure 14:
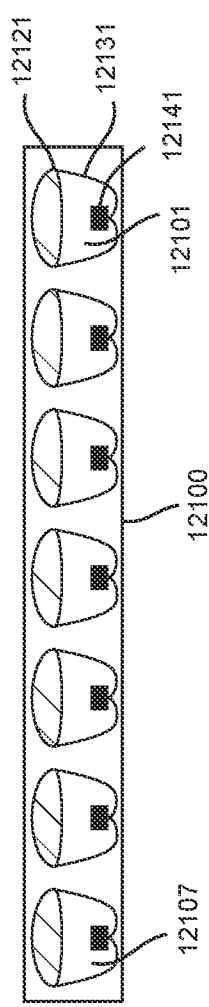
FIG. 14 shows an example of an emitter array with light collection optics for each microLED in the array.

FIG. 14 shows an example of the emitter array with light collection optics for each microLED in the array. The emitter array 12100 has an emitter element 12101 comprising microLED 12141 for emitting light. The light from the microLED may be directed by a reflector 12131, and the light, reflected and non-reflected, may be directed by a lens 12121. The reflector may be a parabolic or imaging reflective optic, or the reflector may be a non-imaging optic designed for improving coupling to a spatially dependent acceptance angle of a subsequent optical channel in the system. The function of the reflector 12131, in various embodiments, can be accomplished with a combination of reflective, refractive and holographic optic beam directing elements. The function of the lens 12121, in various embodiments, can be accomplished with a refractive, diffractive or holographic lens element.

The emitter array may be used with or without light collection optics on each microLED. The emitter array may be used with or without subsequent magnifying optics to reduce the angular range of light from the emitter elements.

Figure 15:
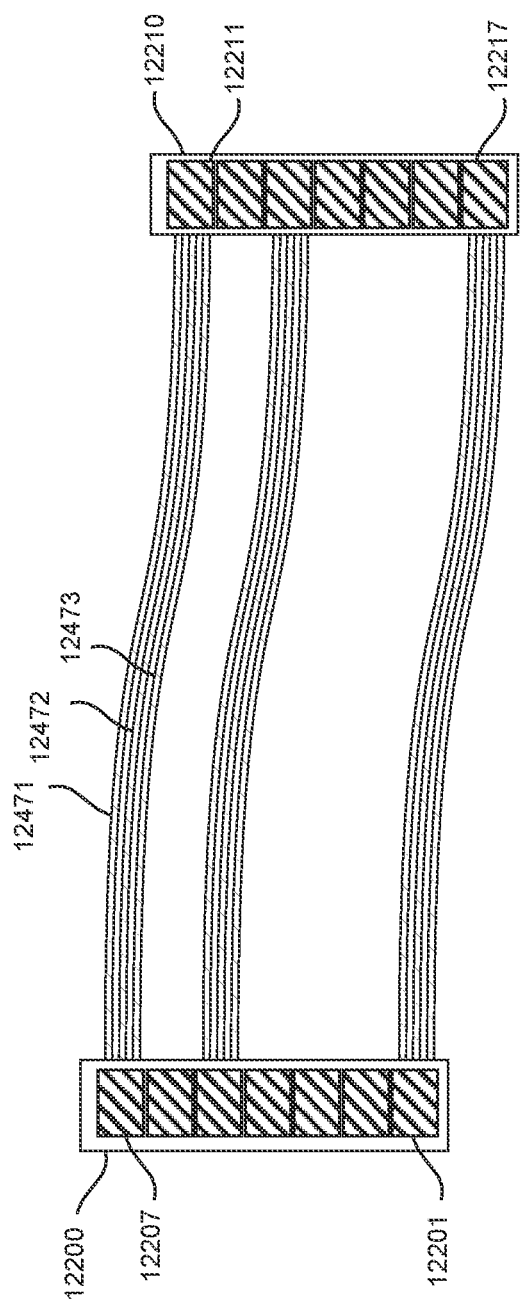
FIG. 15 shows one embodiment of optical transmission channels.

FIG. 15 shows one embodiment of optical transmission channels. The optical transmission channels carry light from optical channel inputs 12200 to optical channel outputs 12210. In some embodiments, a multicore fiber, or a coherent fiber bundle, carries light from all the input optical channels to the output outputs. The number of fiber cores need not match the number of optical channels; in a coherent fiber bundle, the light from each input optical channel is carried in multiple cores. FIG. 15 shows 3 light guides 12471, 12472 and 12473 carrying light from an optical channel input 12207 of the optical transmission channels to an optical channel output 12217 of the optical transmission channels and from optical channel input 201 of the optical transmission channels to optical channel output 12211 of the optical transmission channels. Light guides, 12471, 12472 and 12473 are individual cores in a coherent fiber bundle in some embodiments, or they could be the cores in a multicore fiber in other embodiments.

For some applications it may be preferable for the light guide to be flexible, for example to allow for attachment to optical channel outputs that may be some distance away from the optical channel inputs and may have to accommodate relative position movement due to vibration and thermal expansion. In some embodiments the light guide may be rigid, for example in environments where the movement of the optical channel outputs is small.

Figure 16:
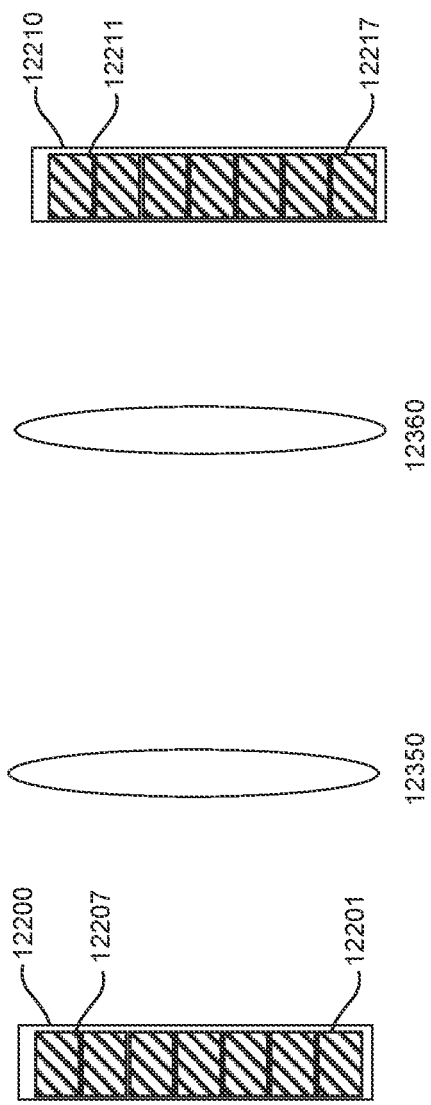
FIG. 16 shows a "4f" relay system.
Figure 2A:
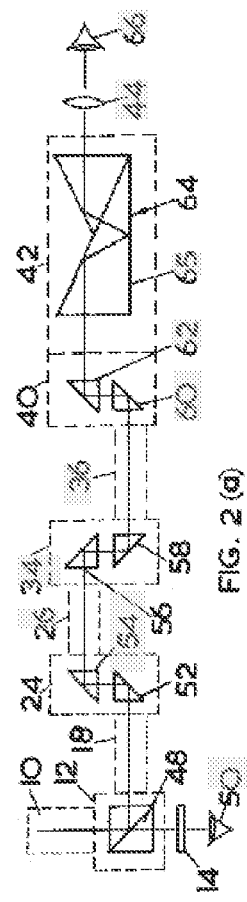

In some embodiments the relay of the light from the optical channel inputs to the optical channel outputs is performed by a relay lens, or by a train of relay lenses, for example as is typically done in a periscope or borescope. A "4f" relay system is shown in FIG. 16. The optical system creates an inverted image of the optical channel inputs 12200 onto the optical channel outputs 12210. A flexible image relay system such as that in U.S. Pat. No. 5,309,541, incorporated by reference herein, would provide a means of relaying the light that can accommodate relative position movement due to vibration and thermal expansion.

Figure 17:
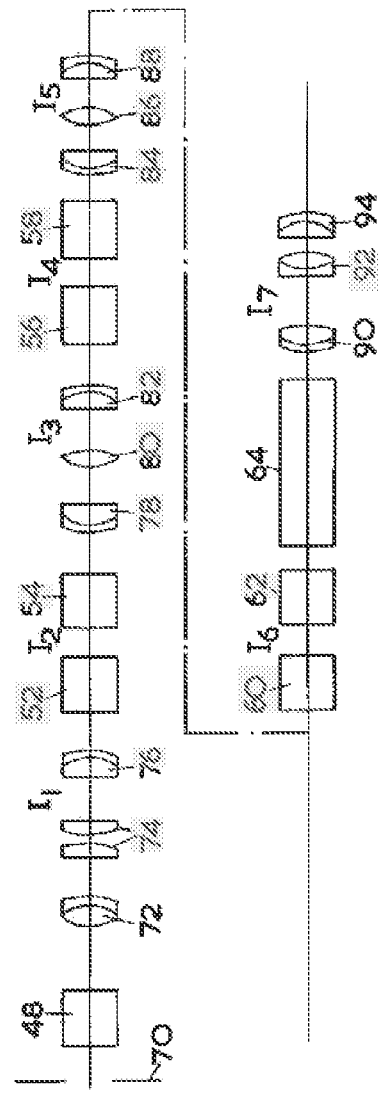
FIG. 17 shows a prior art system that allows for pivoting the optical train around a corner using turning prisms.

In some embodiments an image relay system that turns sharp corners may be used for the optical channel. Such a system may be useful to accommodate size and orientation constraints. An articulated image relay such as described in U.S. Pat. No. 3,994,557, incorporated by reference herein, allows the light to turn corners and allows for relative position movement due to vibration and thermal expansion. For example, the system of FIG. 17 allows for pivoting the optical train around the corner turning prisms 52, 54, 56, and 58 and again at corner turning prisms 60 and 62. Some embodiments utilize an image rotator such as a dove prism 64 to adjust the angle of the image on the detector array. Instead of rotating the image with the dove prism, the received signals could be adapted to a different output through electronic switching after optoelectronic conversion.

In some embodiments one or more optical elements in an imaging system is moved to keep the image of the source steady on the receiver, for example as may be found in motion compensation systems routinely used in photographic camera lenses.

Free-space optic signals have an advantage over both enclosed guided wave optics and electronic signal transmission in that free-space optical signals generally can pass through each other. This advantage may allow for systems with more and denser interconnections. Borescopes and periscopes typically relay light in a closed tube system to keep out surrounding fluids. This closed tube system is often opaque, which does not allow the relayed signals in two different systems to pass through each other.

In order to allow the relayed images to pass through each other in our system, in some embodiments, therefore, the relay optics could be mounted in a cage, or supported on a substrate with no tube. Alternatively, in some embodiments the image relay lenses of the first image relay system could be held in a transparent tube with a rectangular cross section. This would allow a second image relay system to cross this first system laterally without significant distortion. In some embodiments a cross point tube section is utilized, for example to allow the signals in two intersecting tubes to pass through each other.

In some embodiments, a solid optical medium of one optical index of refraction carries the light between lenses of a second optical index of refraction and the lenses are held by the solid itself.

In some embodiments the optical channel passes through an intermediate substrate (e.g. a PCB or interposer) that carries power and electrical signal traces. In some embodiments a hole or a transparent window in the intermediate substrate allows the light in the optical channel to pass through the intermediate substrate.

The optical channel outputs may be butt coupled directly to the optoelectronic receivers.

Figure 18:
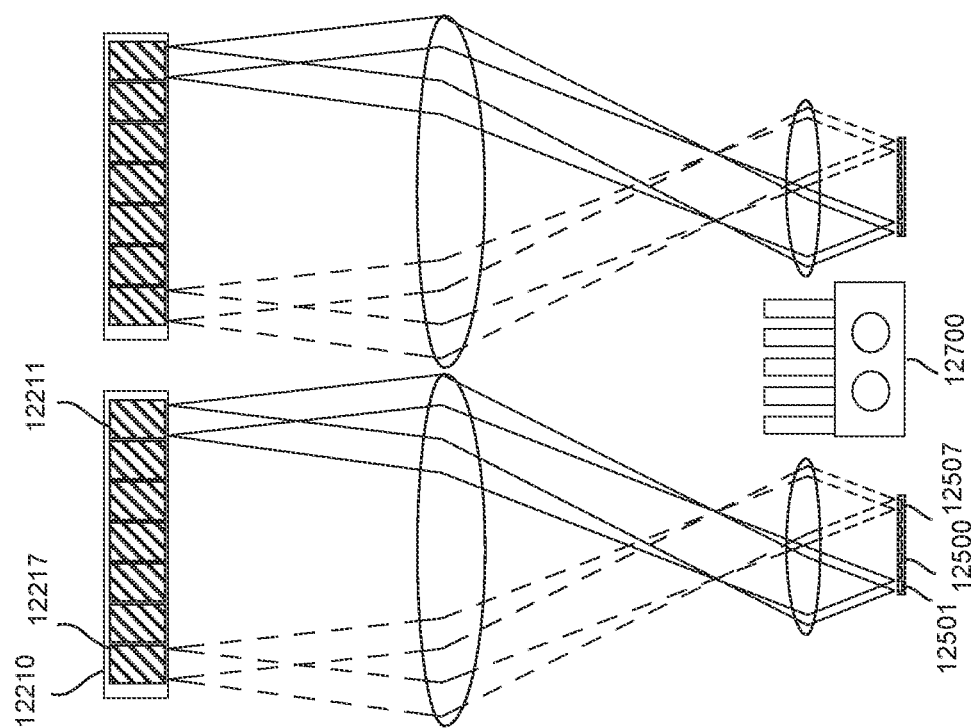
FIG. 18 shows an optical channel output coupled to an optoelectronic receiver through a demagnification system.

Alternatively, it may be advantageous to provide a demagnification system, analogous to the systems shown in FIG. 12 and FIG. 13. One of these, shown in FIG. 18, shows the optical channel output 12211 coupled to an optoelectronic receiver 12501, through a demagnification system.

It may be preferable to include demagnification at the receiver since typical optoelectronic detectors can receive over a larger angular range than the optical channel. It may also be beneficial to include demagnification to allow room for additional structures such as a heat sink 12700, as shown in FIG. 18, between two demagnification systems. A heat sink in such a system may include fins, heat pipes, circulating fluid, or other means of conducting heat away from the system.

Light from each microLED can be connected to a photodetector via a waveguide on a planar substrate; such links may be referred to as planar-launch parallel optical links (PLPOLs). The substrate may be rigid if or flexible. There may be a single layer of waveguides on the substrate, or there may be multiple layers of waveguides.

Figure 19:
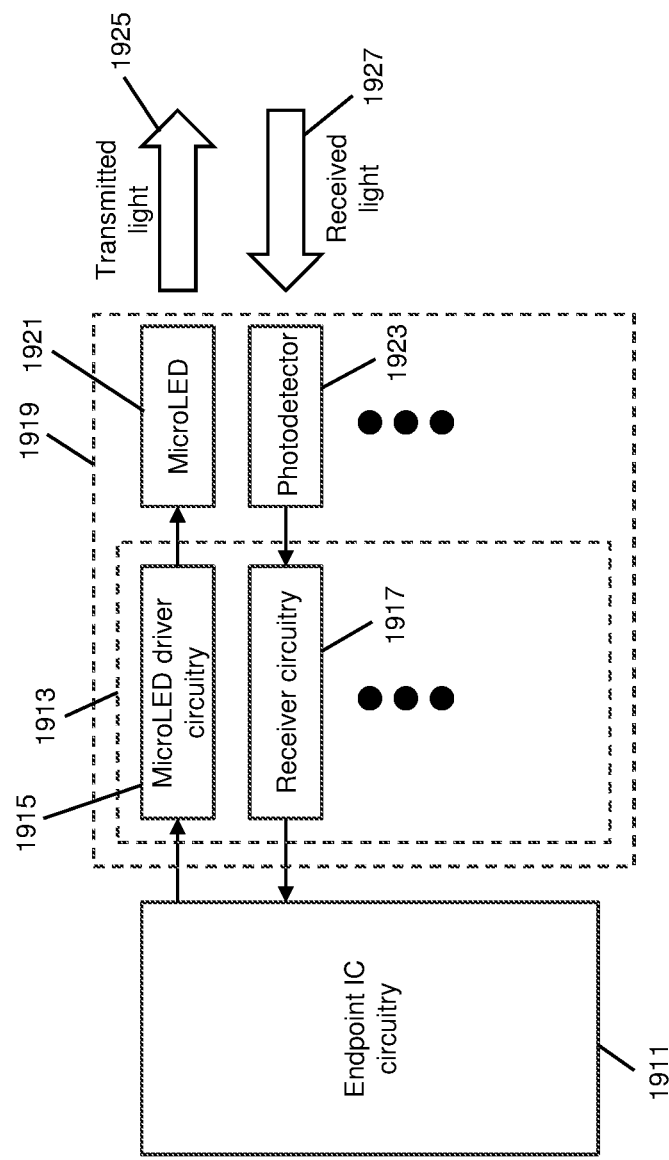
FIG. 19 is a block diagram showing an electrical architecture of a first optically-interconnected IC, in accordance with aspects of the invention.

FIG. 19 is a block diagram showing an electrical architecture including a first optically-interconnected IC. The IC includes IC circuitry 1911 for performing logic and/or other functions. Transceiver circuitry 1913 is coupled to the IC circuitry. The transceiver circuitry comprises, and in some embodiments consists of, an array of microLED driver circuitry 1915 and an array of receiver circuitry 1917. The transceiver circuitry is part of a transceiver subsystem 1919. The transceiver subsystem also includes an array of microLEDs 1921 and photodetectors 1923. In some embodiments the transceiver circuitry may be monolithically integrated into the same IC containing the endpoint IC circuitry.

In some embodiments the transceiver circuitry or may be contained in one or more separate transceiver ICs. The microLED driver circuitry drives the array of microLEDs to emit light 1925 to carry information provided to the driver circuitry from the endpoint IC circuitry. An N-bit wide unidirectional parallel bus connection may be implemented with N optical links from the transceiver subsystem to a second IC (not shown in FIG. 19), or, in some embodiments, a plurality of second ICs. A corresponding unidirectional parallel bus may be implemented by adding N additional optical links from the transceiver subsystem of the second IC to the transceiver subsystem of the first IC. The photodetectors receive light 1927 from the corresponding parallel bus, the light carrying information from the second IC. The photodetectors provide electrical signals carrying the received information to the receiver circuitry, which processes the signals and provides the information to the endpoint IC circuitry.

The optoelectronic (OE) devices, for example the microLEDs and photodetectors, may include structures that enhance optical coupling efficiency. For instance, microLEDs may include various structures that improve the light extract efficiency (LEE), including surface roughening, particular LED shapes, and encapsulation in high-index materials. They may also include structures such mirrors and lenses that collect the light from the LED's large intrinsic emission solid angle into a smaller solid angle that is better matched to the numerical aperture of the rest of the optical link. MicroLEDs are amenable to this reduction of angular cone due to their small size and thus relatively small etendue.

In some embodiments the OE devices can be integrated with the transceiver IC through hybrid integration techniques. FIG. 20a shows an embodiment in which the hybrid integration technique is direct bonding. In FIG. 20a, a substrate with OE devices 2011 is coupled to a transceiver IC 2013 by way of direct bonds 2015. FIG. 20b shows an embodiment in which the hybrid integration technique is solder bump bonding. In FIG. 20b, the substrate with OE devices 2011 is coupled to the transceiver IC 2013 by way of solder bumps 2017. In some embodiments OE devices 2021 can be monolithically integrated into a transceiver IC 2023, as illustrated in FIG. 20c. The viability of monolithic integration may be strongly dependent on the IC material and the source wavelength. Silicon generally supports monolithic integration of photodetectors for wavelengths<1 um but may be not viable for monolithic optical source integration because it is an indirect bandgap material. By contrast, GaAs, InP, and GaN support monolithic integration of both photodetectors and optical sources. It is possible to mix monolithic and hybrid integration on a single transceiver IC. For instance, a transceiver IC may include microLEDs that are directly bonded to the IC along with monolithically-integrated photodiodes.

Figure 21B:
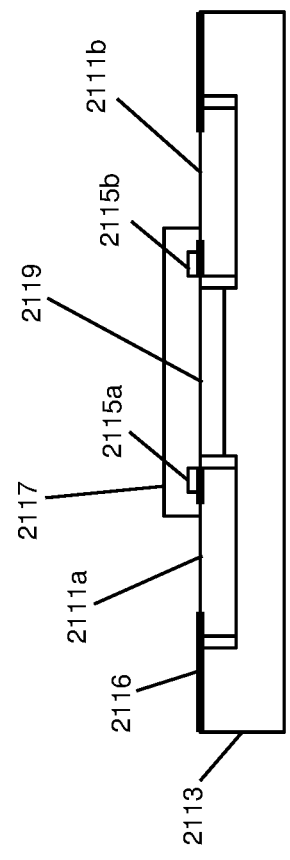
FIGS. 21a-c show different physical configurations for implementing a transceiver subsystem, in accordance with aspects of the invention.
Figure 21C:
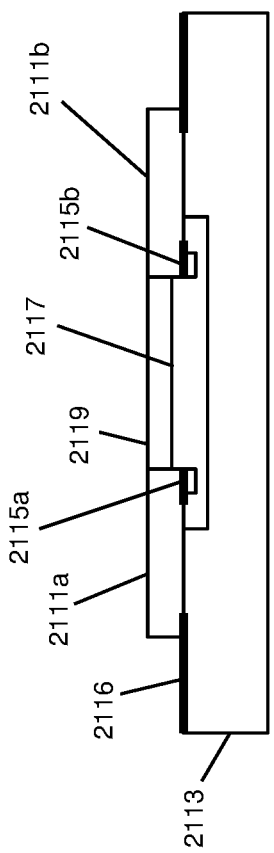
Figure 21A:
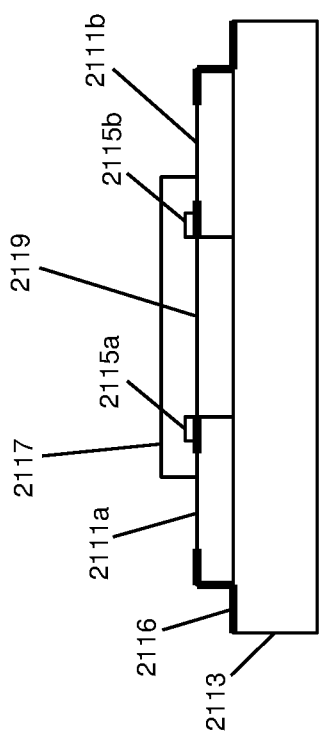

The transceiver subsystem can be implemented in a number of different physical configurations, for example as illustrated in FIGS. 21a-c. The configurations include a substrate, which may be rigid or flexible. Rigid substrate materials include silicon, glass, and laminates that include epoxy or resin. Flexible substrates may be made from various polymers.

In FIG. 21a, a first transceiver IC 2111a is mounted to the top of a substrate 2113 with an active side facing up. A first OE device 2115a is on top of the transceiver IC. The first transceiver IC in some embodiments is a very thin "micro-IC" that is only a few tens of microns thick. Electrical connections from a first endpoint IC (not shown in FIG. 21a)

to the first transceiver IC are made by deposited metal traces 2116 that traverse the top of the substrate, and the side and top surfaces of the first transceiver IC. The first OE device is shown on the active side of the first transceiver IC. The first OE device receives signals from and/or provides signals to the first transceiver IC. The first OE device is shown as embedded or encapsulated in a waveguide core 2117. The waveguide core extends to a second transceiver IC 2111*b*, with waveguide cladding 2119 being shown as on top of the substrate between the first and second transceiver ICs. A second OE device 2115*b* is shown as on an active side of the second transceiver IC, with the second OE device also shown as embedded or encapsulated in the waveguide core. The second transceiver IC and the second OE may be as discussed with respect to the first transceiver IC and the first OE. As with the first transceiver IC, the second transceiver IC has electrical connections from a second endpoint IC (not shown in FIG. 21*a*). The first and second transceiver ICs, OE devices, and waveguide therefore may provide for optical communications substantially between the first endpoint IC and the second endpoint IC.

In FIG. 21*b*, the transceiver ICs 2111*a,b* are placed in a cavity in the substrate 2113. A material may be used to fill any gaps between the ICs and the substrate. This, for example, allows planar electrical connections from the substrate to the ICs. As with FIG. 21*a*, the OE devices 2115*a,b* are on top of the transceiver ICs.

In FIG. 21*c*, the transceiver ICs 2111*a,b* are mounted to the substrate 2113 with their active sides facing down. Such may simplify electrical connections from the substrate to the transceiver ICs. In FIG. 21*c*, part of each of the transceiver ICs containing the OE devices 2115*a,b* hangs over a cavity in the substrate. The OE devices are on the bottom of the transceiver ICs, in the cavity in the substrate.

For the embodiments of FIGS. 21*a-c*, the wave guide cores may be an array of planar optical waveguides, for example comprised of a bottom cladding and an array of cores, each of which guides light from a microLED at one end to a photodetector at the other end. Alternatively, both a microLED and photodetector can be located at both ends of each waveguide. This enables bidirectional transmission through each waveguide, supporting a duplex link.

In the embodiments of FIGS. 21*a-c*, a waveguide cladding layer is deposited in an appropriate region of the substrate. A layer of waveguides cores is fabricated on top of (or below for FIG. 21*c*) the cladding layer in a manner such that each OE device is encased in a separate waveguide core.

Figure 22:
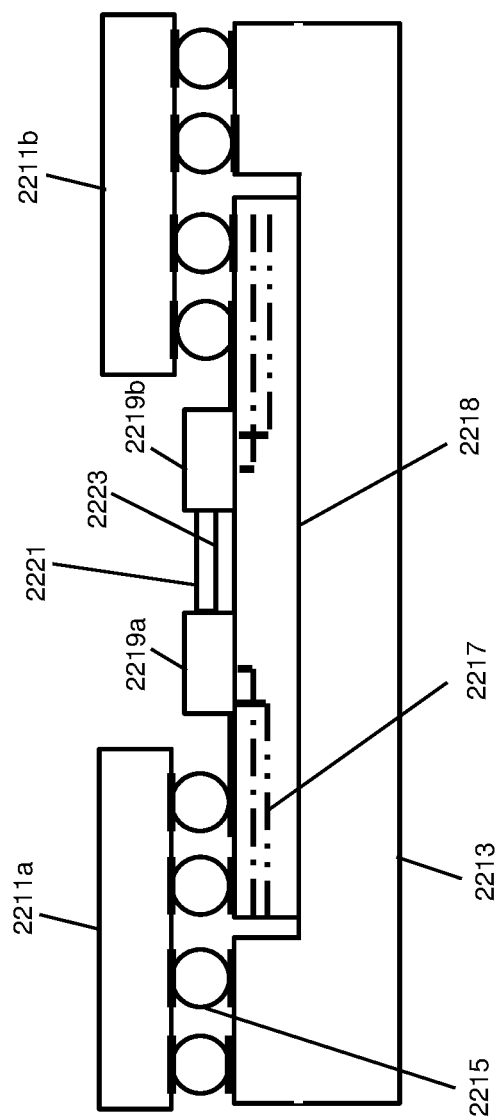
FIG. 22 shows integration of planar optical links within a package, in accordance with aspects of the invention.

FIG. 22 shows integration of planar optical links within a package. A first endpoint IC 411*a* is mounted to pads on a package 2213 by way of solder bumps 2215. Some pads connect to traces in metal signal layers 2217 of the package (or a substrate 2218 of the package), providing connection to a first transceiver subsystem 2219*a*. The first transceiver subsystem may be as discussed previously. One or more waveguide cores 2221 couple the first transceiver subsystem to a second transceiver subsystem 2219*b*, which may also be as discussed previously. For example, the waveguide cores may be separated from substrate by waveguide cladding 2223. The second transceiver subsystem is connected to a second endpoint IC 2211*b*, also by traces in metal signal layers of the package (or a substrate of the package). In FIG. 22, the metal signal layers of the package do not provide for electrical communications between the first endpoint IC and the second endpoint IC, although in some embodiments such may be additionally provided.

Figure 23:
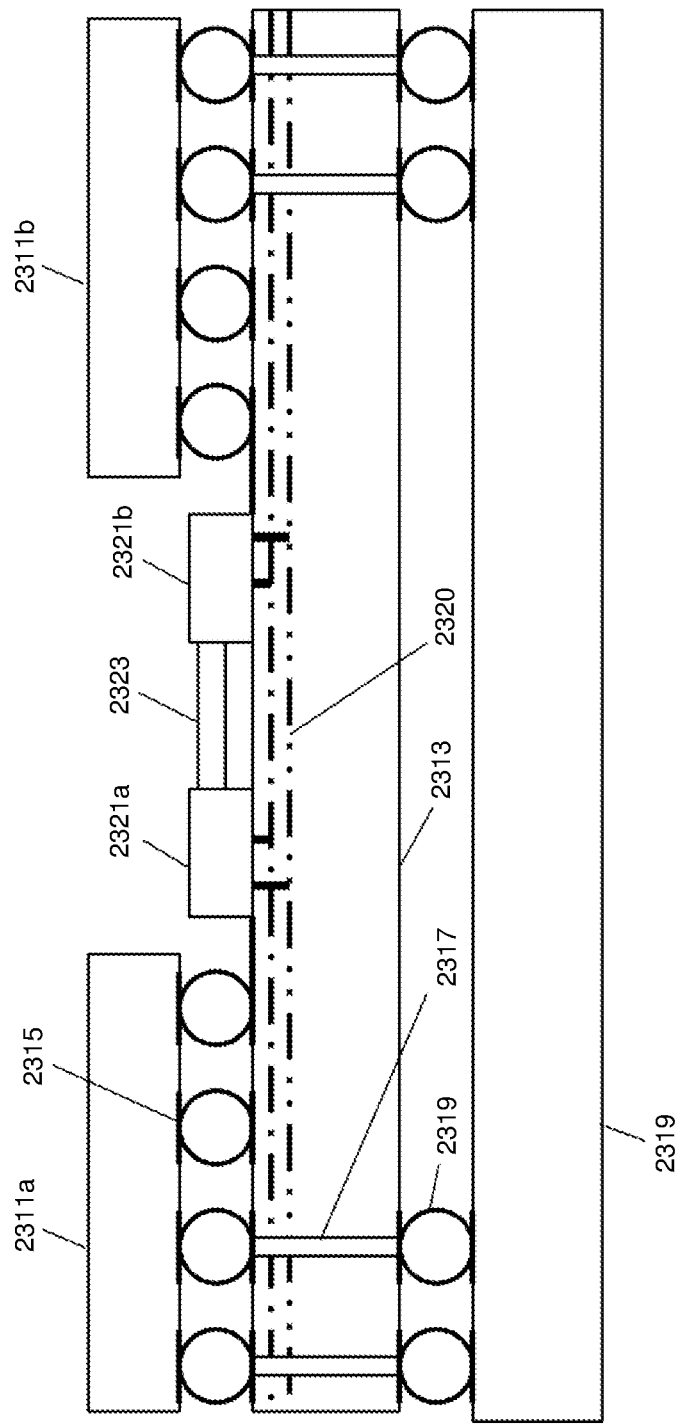
FIG. 23 shows integration of optical links within an interposer and package, in accordance with aspects of the invention.

FIG. 23 shows the integration of planar optical links within an interposer and package. A first endpoint IC 2311*a* is mounted to pads on the interposer 2313 with solder bumps 2315. Some of the pads connect to through-substrate vias (TSVs) 2317 that, in turn, connect to the package 2319 via solder bumps. Other pads of the interposer connect to traces in metal signal layers 2320 of the interposer providing connection to a first transceiver subsystem 2321*a*. The first transceiver subsystem may be as discussed previously. One or more waveguide cores 2323 couple the first transceiver subsystem to a second transceiver subsystem 2321*b*, which may also be as discussed previously. The second transceiver subsystem is connected to a second endpoint IC 2311*b*, also by traces in metal signal layers of the interposer. In FIG. 23, the metal signal layers of the interposer provide for electrical communications between the first endpoint IC and the second endpoint IC, although in some embodiments such is not provided.

FIGS. 20*a-c* showed examples of optoelectronic devices integrated onto the active side of an IC. In a vertically-launched parallel optical link (VLPOL), a 2D array of OE devices is integrated with the IC. The optoelectronic (OE) devices, comprise, and in some embodiments consist of, a combination of microLEDs and photodetectors.

As discussed above, the OE devices can be monolithically-integrated or hybrid-integrated with the IC. Generally, the viability of monolithic integration depends on the IC material and link wavelength. In the case of heterogeneous integration, die with large arrays of LEDs or photodetectors may be attached to the IC in a single attachment process.

Note that the OE devices may, in general, be located anywhere on the IC surface. This ability to place optical IO anywhere on the IC surface may provide a number of benefits, including: interconnect density that scales with IC area rather than edge length, enabling increased chip-to-chip interconnect density; and ability to place off-chip interconnects very close to associated processing logic, allowing for more flexible optimized IC layout and reducing on-chip interconnect resources.

Figure 24D:
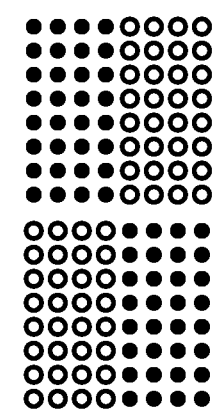
FIGS. 24a-e show various optoelectronic device configurations, in accordance with aspects of the invention.
Figure 24E:
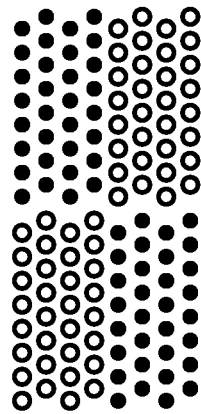
Figure 24B:
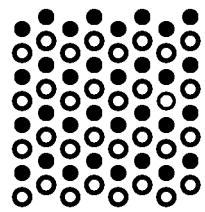
Figure 24A:
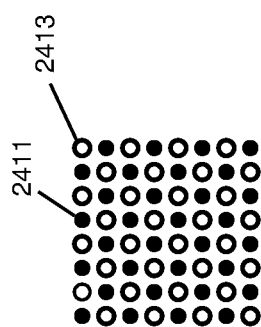

It is frequently desired that the links be bidirectional. In the case of highly parallel bussed optical connections, it may be desirable to have both directions of the link in close physical proximity to each other. This can be accomplished by various optoelectronic device configurations as shown in FIGS. 24*a-e*. In FIG. 24*a*, microLEDs 2411 and photodetectors 2413 are alternated with each other on a rectangular grid. In FIG. 24*b* the microLEDs and photodetectors are alternated on a hexagonal grid. Both of these configurations have each photodiode close to multiple microLEDs, which can create electrical and optical crosstalk problems. These configurations may also be unattractive from a manufacturing/assembly standpoint because it may be easier to fabricate and assembly monolithic arrays of OE devices.

Figure 24C:
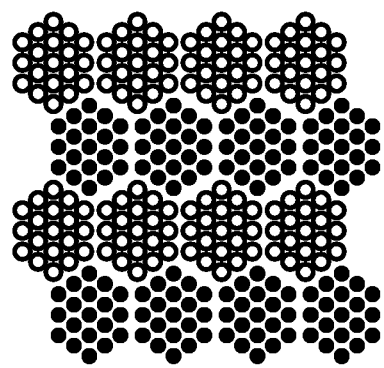

The problems associated with these alternating configurations can be overcome or reduced by "tiling" alternating arrays of microLEDs and photodetectors. FIG. 24*c* shows hexagonal tiles of microLEDs and photodetectors, with individual devices on a hexagonal grid. FIG. 24*d* shows rectangular tiles of microLEDs and photodetectors, with individual devices on a rectangular grid. FIG. 24*e* shows approximately rectangular tiles of microLEDs and photodetectors, with individual devices on a hexagonal grid.

The two-dimensional OE device array may be butt-coupled into an array of multicore waveguides. Various types of multicore waveguides may be used. FIG. 25*a* shows a cross-sectional view of a multicore fiber in which each core may be coupled to one microLED on one end and one photodetector on the other end. The multicore fiber of FIG. 25a includes a plurality of waveguide cores 2511, with each core surrounded by cladding 2513.

Figure 25B:
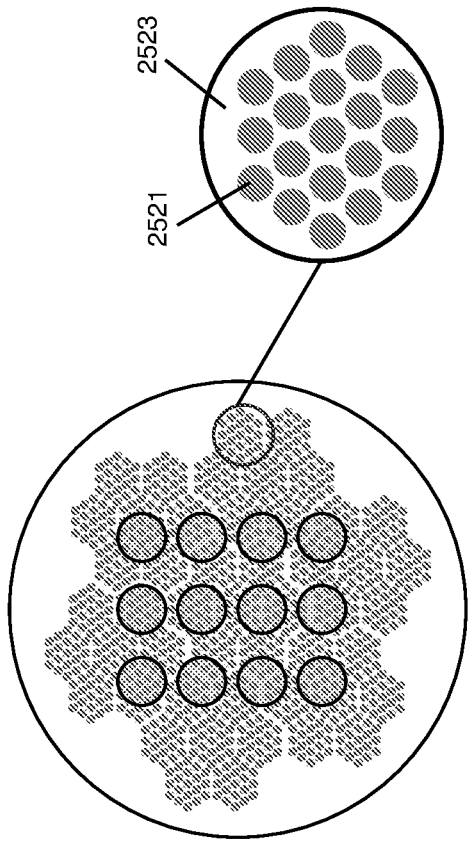
FIG. 25b shows a cross-sectional view of coherent imaging fiber, with an exploded view of a portion of the fiber, in accordance with aspects of the invention.

FIG. 25b shows a cross-sectional view of coherent imaging fiber, with an exploded view of a portion of the fiber. The fiber is comprised of a large number of very small diameter "micro-cores" 2521 with the cores surrounded by cladding 2523. The term "coherent imaging fiber" refers to the fact that the optical intensity distribution at an input face of the fiber is approximately reproduced at the output face of the fiber. More accurately, the output optical distribution is a spatially sampled version of the input optical distribution, where the spatial sampling frequency is determined by the center-to-center spacing of the micro-cores. In some embodiments the cores are sufficiently small and closely spaced that the light from each microLED forms a spot spanning multiple cores, and multiple cores thus transport the light from each input microLED to each photodetector. Such an arrangement flexibly accommodates various optical configurations (e.g., different numbers of OE devices, different spot sizes from the microLEDs). Differential phase shifts across cores could cause output speckle problems with a spatially coherent input, but the low spatial and temporal coherence associated with a microLED source generally reduces or eliminates speckle problems.

Figure 25C:
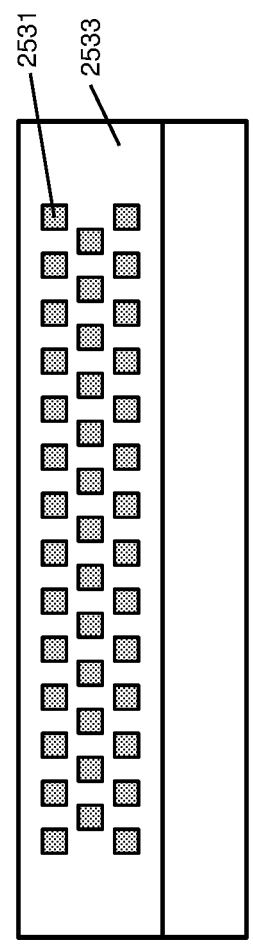
FIG. 25c shows a multi-layer planar waveguide stack, in accordance with aspects of the invention.
Figure 25A:
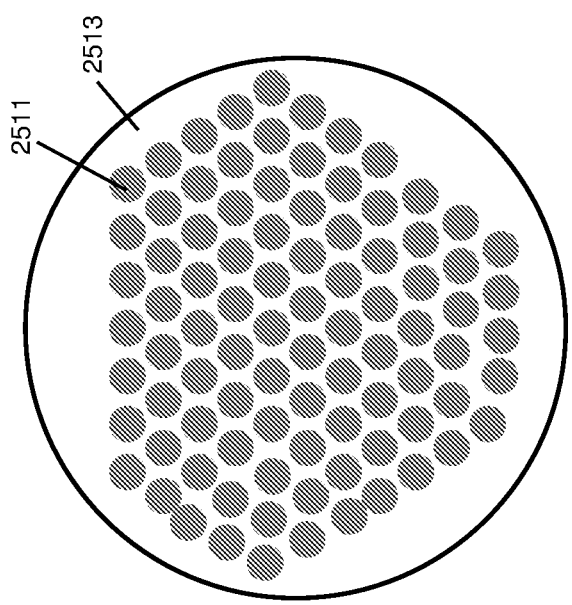
FIG. 25a shows a cross-sectional view of a multicore fiber, in accordance with aspects of the invention.

FIG. 25c shows a multi-layer planar waveguide stack. The multi-layer planar waveguide stack includes a plurality of planar layers, with each planar layer including a plurality of waveguide cores 2531, surrounded by waveguide cladding 2533. Planar waveguides may be commonly used in a single-layer configuration. Multiple layers can be stacked to implement a 2D array of waveguides. The waveguide array may be fabricated on a rigid or flexible planar substrate, but there are significant advantages to the use of flexible substrate, including: for highly interconnected architectures with ICs lying in a plane, many connections may cross over each other; and if we have the freedom to distribute ICs across multiple substrates which may or may not be lying in a plane, the use of flexible waveguides may traverse the third dimension.

Even with high-performance optical links, ICs still generally use many electrical connections for power, ground, and control lines. Therefore, optical links should coexist with electrical packaging. High-performance packaging typically uses solder bumps or direct bonding to create dense connections from an active circuit side of an IC to a substrate with good electrical and thermal characteristics.

Figure 26B:
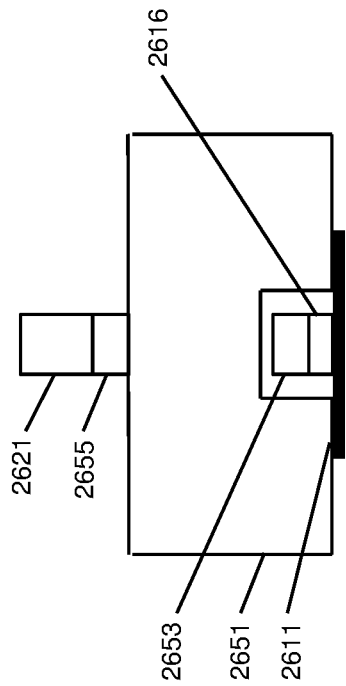
FIG. 26b shows an example of use of a transparent substrate, in accordance with aspects of the invention.
Figure 26A:
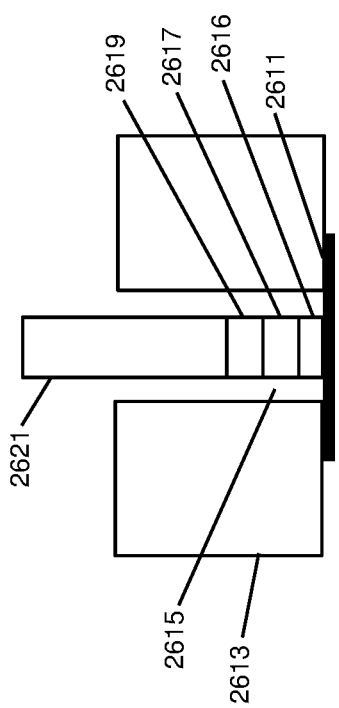
FIG. 26a shows a hole in a substrate that allows an optical connection to traverse to the other side of the substrate, in accordance with aspects of the invention.

It is advantageous to make optical connections from this same active circuit side of the IC. However, this potentially creates problems because the substrate is very close to the IC when using bumps or direct bonding. To allow adequate space for the optical connections, it may be advantageous for the optical connections to traverse the substrate. FIG. 26a shows a hole in a substrate that allows an optical connection to traverse to the other side of the substrate. An optical coupling assembly and a multicore waveguide assembly both fit within the hole. As shown in FIG. 26a, an IC 2611 is mounted to a substrate 2613. The substrate includes a hole 2615, with the hole over a portion of the IC (or under a portion of the IC, depending on orientation). An OE device array 2616 is mounted on the IC, within a volume of the hole. An optical coupling assembly 2617 is on the OE device array, with a multicore waveguide coupling assembly 2619 coupled to the optical coupling assembly. Both the optical coupling assembly and the multicore waveguide coupling assembly are within the hole in the substrate, in the embodiment illustrated in FIG. 26a. A multicore waveguide 2621 extends from the multicore waveguide coupling assembly, out through a side of the substrate opposite that of the IC.

The use of a substrate that is transparent at the link's wavelength enables an alternative approach. FIG. 26b shows an example of use of a transparent substrate. In FIG. 26b, the IC 2611 is mounted to a transparent substrate 2651. The optoelectronic (OE) device array 2616 is on the IC and coupled to the multicore waveguide assembly through the substrate by optical coupling assemblies placed on both sides of the substrate, with FIG. 26b showing an optical coupling assembly 2653 on the OE device array and a multicore waveguide coupling assembly 2655 on an opposing side (from the IC) of the transparent substrate. The multicore waveguide 2621 extends from the multicore waveguide coupling assembly and away from the substrate. Some embodiments may include a cavity on the OE side of the substrate to accommodate the optical coupling assembly, for example as shown in FIG. 26b.

Figure 27B:
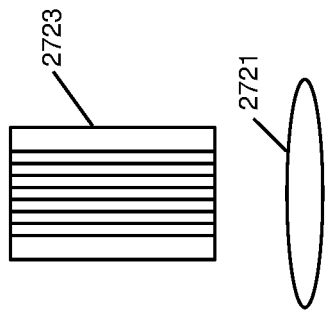
FIG. 27b shows an MW subassembly, in accordance with aspects of the invention.
Figure 27A:
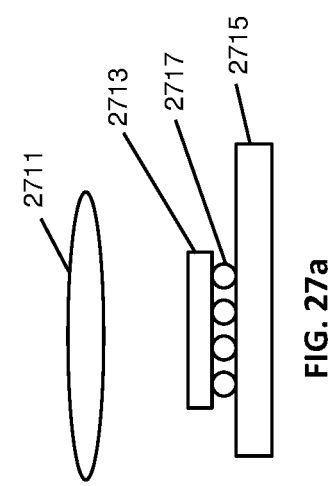
FIG. 27a show an optoelectronic (OE) subassembly in accordance with aspects of the invention.

An exemplary optical coupling assembly implementation comprises, and in some embodiments consists of, an optoelectronic (OE) subassembly and a multi-waveguide (MW) subassembly. FIG. 27a show an OE subassembly. In the OE subassembly, a lens 2711 may be placed approximately one focal length from an OE device array 2713. In the example of FIG. 27a, the OE device array is shown mounted to an IC 2715 by solder bumps 2717. FIG. 27b shows an MW subassembly. In the MW subassembly, a lens 2721 may be placed approximately one focal length from a multicore waveguide (MW) array 2723. The space between the two lenses can span a relatively large range, allowing its use both of the aforementioned substrate traversal arrangements with a wide variety of different substrate thicknesses. The large tolerance of the space between lenses simplifies assembly and may allow for increases manufacturing yields.

Figure 27D:
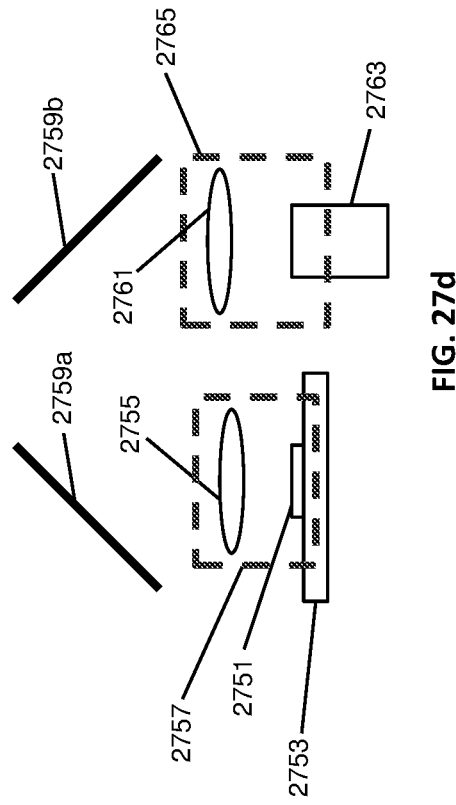
FIG. 27d shows the use of two turning mirrors to turn a light beam by one hundred eighty degrees, in accordance with aspects of the invention.
Figure 27C:
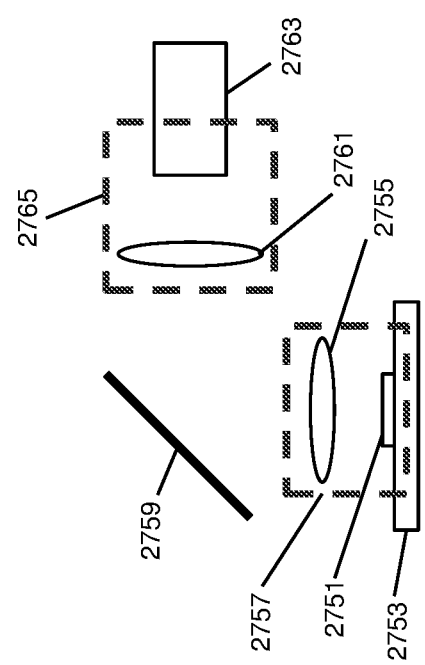
FIG. 27c shows the use of a turning mirror to turn a light beam by ninety degrees, in accordance with aspects of the invention.

The ability to accommodate a large space between the lenses also allows the insertion of additional optical elements such as turning mirrors. In FIG. 27c, an OE device array 2751 is on an IC 2753. Light to or from the OE device array passes through a first lens 2755. The first lens, and in some embodiments also the OE device array, may be considered an OE coupling assembly 2757. A turning mirror 2759 reflects, or turns, the light by 90 degrees, to or from a second lens 2761. The light passing through the second lens arrives at or comes from a multicore waveguide 2763. The second lens, and in some embodiments an end face of the multicore waveguide, may be considered a MW coupling subassembly 2765. FIG. 27c shows the use of the turning mirror to turn the beam by 90°. This is a powerful technique for decreasing the size of systems using vertically launched parallel optical links (VLPOLs). As shown in FIG. 27d, two turning mirrors 2759a,b can be used inserted between the first and second lenses 2755, 2761 to turn light 180°, which can be useful in various circumstances, for example if a direction of emission orientation of a microLED is opposite that of a desired signal path or a variety of other circumstances.

As indicated above, the OE devices may be vertically coupled out of a plane; such links may be referred to as vertically-launched parallel optical links (VLPOLs). In various embodiments the OE devices can be monolithically-integrated or hybrid-integrated onto the active side of an IC. Light can be coupled from/to arrays of OE devices to a multi-waveguide (MW) array using various optical coupling assemblies. In many embodiments the multi-waveguide array includes a plurality of optical waveguides, or waveguide cores. In some embodiments the number of waveguides may be the same as the number of transmission channels (which may be bidirectional in some embodiments), and in some embodiments the number of waveguides may be greater than the number of transmission channels. FIG. 28a shows a two-dimensional (2D) OE device array 2811 that is butt-coupled to a 2D array of waveguides, a multicore waveguide (MW) 2817 as shown in FIG. 28a. As shown in FIG. 28a, the OE device array itself is coupled by solder bumps to an IC chip 2813.

Figure 28B:
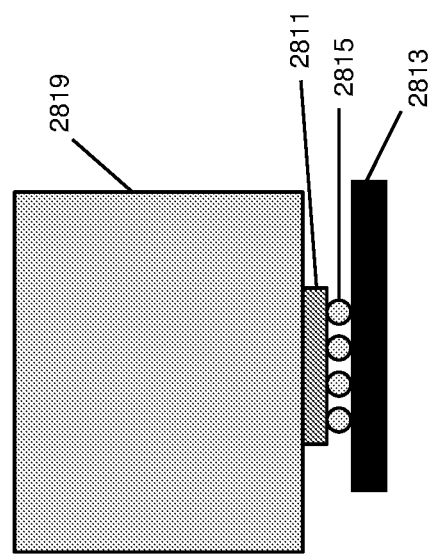
FIG. 28b shows a 2D OE device array coupled to a free-space propagation medium.
Figure 28A:
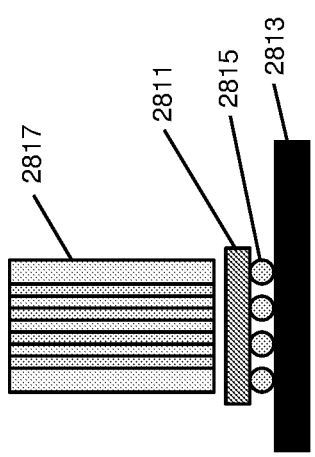
FIG. 28a shows a two-dimensional (2D) OE device array that is butt-coupled to a 2D array of waveguides.

Alternatively, the OE device array 2811 can be coupled to a free-space propagation medium 2819, as shown in FIG. 28b. The free-space propagation medium may include various optical elements including lenses, mirrors, gratings, and/or holographic optical elements (HOEs).

The MW array can be implemented in a number of ways, including multicore fiber, coherent imaging fiber, and multilayer waveguide arrays. All of these can be implemented to be physically flexible, enabling complex routing in 3D space. Various of these are discussed above, for example with respect to FIG. 15. It may be desirable to use multimode waveguides with microLED optical sources to achieve high source-to-waveguide optical coupling efficiency.

MW arrays can also be fabricated in solid transparent bulk media. This allows the creation of very general optical waveguide structures in 3D. Such structures can be created in a number of ways including laser inscription (using a highly focused pulsed laser) and photorefractive writing.

The MW array supports multimode guided wave propagation, which enables high coupling efficiency from microLED sources. Optical signals experience modal and chromatic dispersion, which cause problems for longer links. However, for MW arrays that are properly designed for the microLED wavelength, 10 Gbps signals are not excessively degraded for link lengths on the order of 1 meter. Similarly, signal loss for 1 meter links is not excessive with properly designed MW arrays that do not exhibit excessive attenuation per unit length at the MW wavelength.

As indicated above, FIG. 27a and FIG. 27b show OE and MW coupling subassemblies, respectively, using a telescope configuration. The OE and MW coupling subassemblies can be coupled to each other with a relatively large gap between the assemblies (the gap can be multiple times the lens diameter). This large gap allows the insertion of turning mirrors to support the ability to turn the beam 90° and 180°. This may increase vertically launched parallel optical links (VLPOL) flexibility and density when used in various physical topologies.

High-performance electrical packaging typically uses solder bumps or direct bonding to create dense connections from the active circuit side of an IC to a substrate with good electrical and thermal characteristics. In some embodiments the OE devices are integrated onto this active IC side, but the substrate may be very close to the IC. To allow adequate space for the optical connections, in some embodiments the optical connections traverse the substrate so that optical connections can be made on the other side of the substrate. A VLPOL can traverse a substrate through a hole in a substrate, for example as indicated with respect to FIG. 26a, or can be optically coupled through a transparent substrate, for example as indicated with respect to FIG. 26b.

Different applications may best make use of very different types of interconnect networks (INs). INs can be classified as direct or indirect networks. There are numerous widely-used topologies for each of these network types.

Figure 29A:
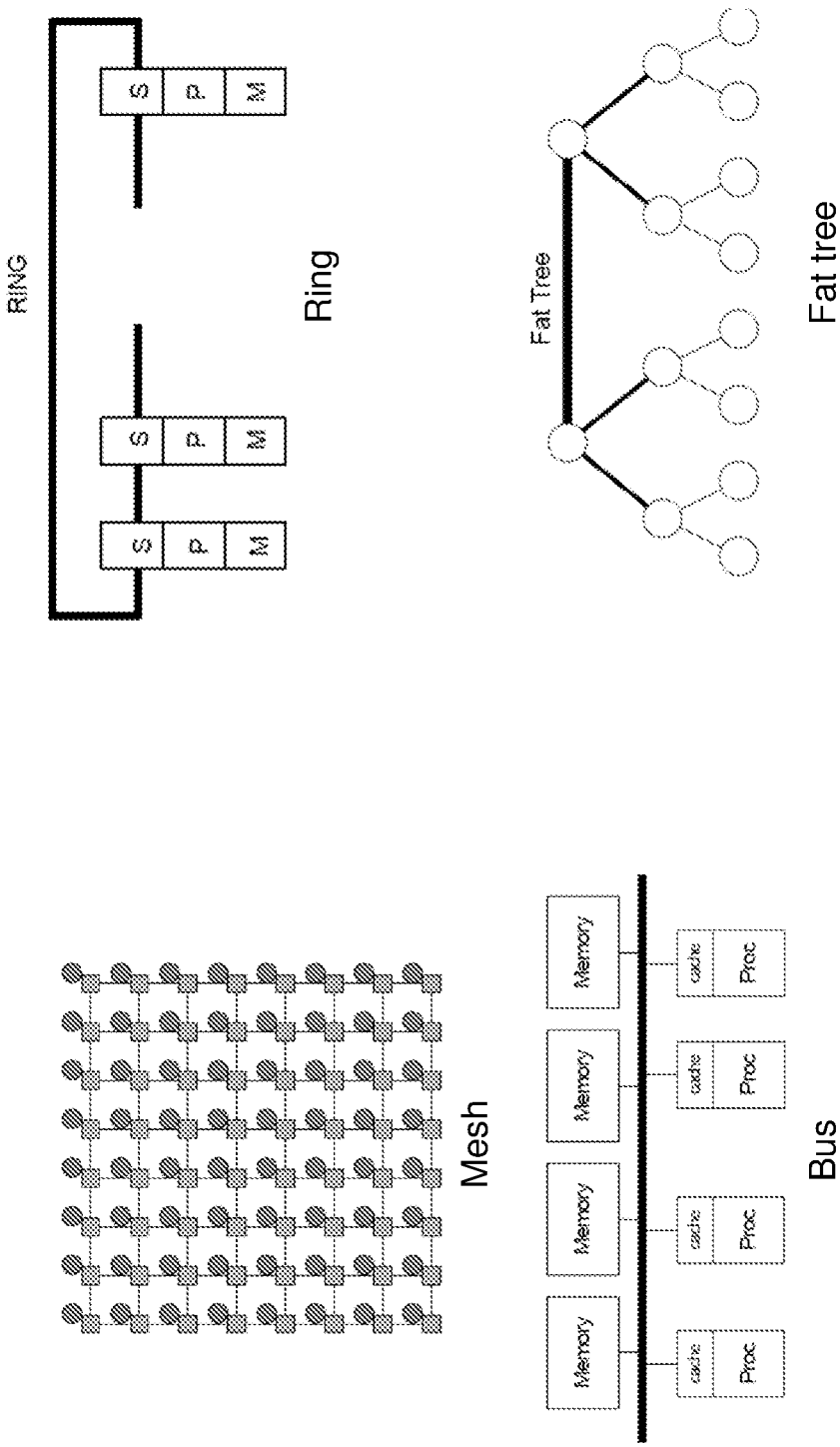
FIG. 29a shows network topologies using just nearest-neighbor connectivity.

A few network topologies use just nearest-neighbor connectivity, including bus, ring, tree, and mesh networks, for example as illustrated in FIG. 29a. These topologies are relatively well-suited to implementation using short electrical connections on a planar substrate. However, these topologies have very limited connectivity and may perform well only in specific applications. Even with these highly constrained topologies, VLPOLs may provide significant benefits compared to electrical interconnects, including, in some embodiments, much lower energy per bit and/or scalability to interconnecting multiple substrates.

Figure 29B:
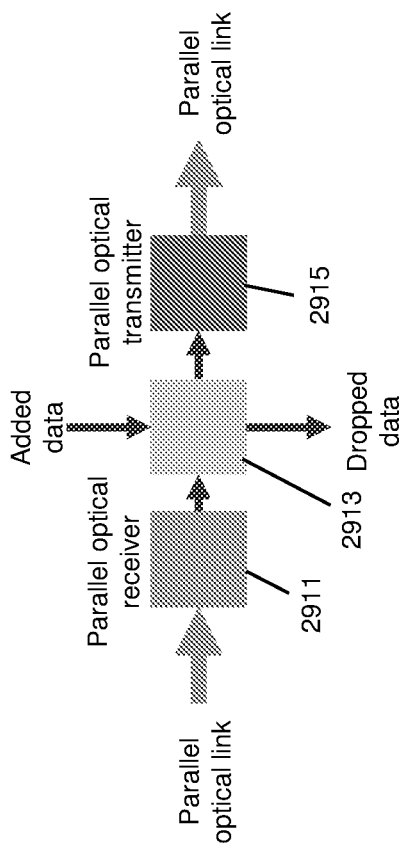
FIG. 29b illustrates an add/drop node.

In some variants of these simple networks topologies, the same signal is sent to more than one node. These cases can make use of add/drop nodes. In some embodiments, and as illustrated in FIG. 29b, the add/drop node may comprise, or consist of in some embodiments, a parallel optical receiver 2911, add/drop electronics logic 2913, and a parallel optical transmitter 2915. The add/drop electronics determine what data is dropped and added locally, and which data is sent through. A special case of this is an optical repeater, where all of the data may be sent through to the other optical link but is also dropped locally.

Figure 29C:
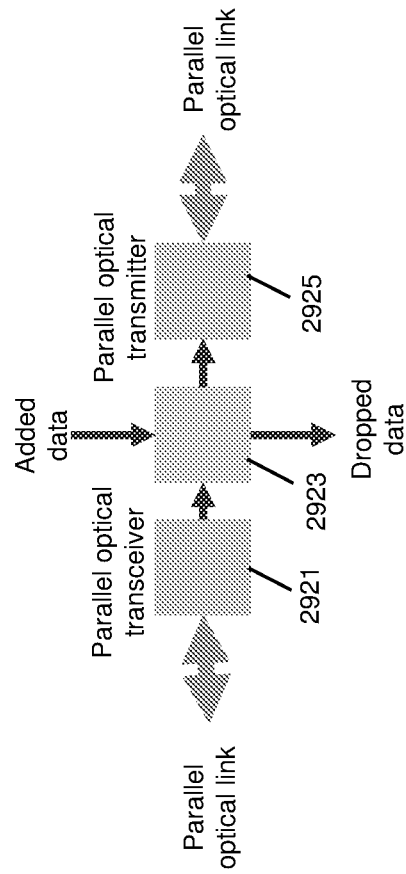
FIG. 29c shows a bidirectional version of an add/drop node.

A bidirectional version of an add/drop node is shown in FIG. 29c, where both optical links are bidirectional, and the add/drop logic is capable of flexible operations on data flowing in both directions. In FIG. 29c, the add/drop logic 2923 is between a first parallel optical transceiver 2921 and a second parallel optical receiver 2925. Among other functionality, this allows loopback connections where incoming data from one direction on a link is dropped locally and then added to the other direction of the same link.

Figure 30:
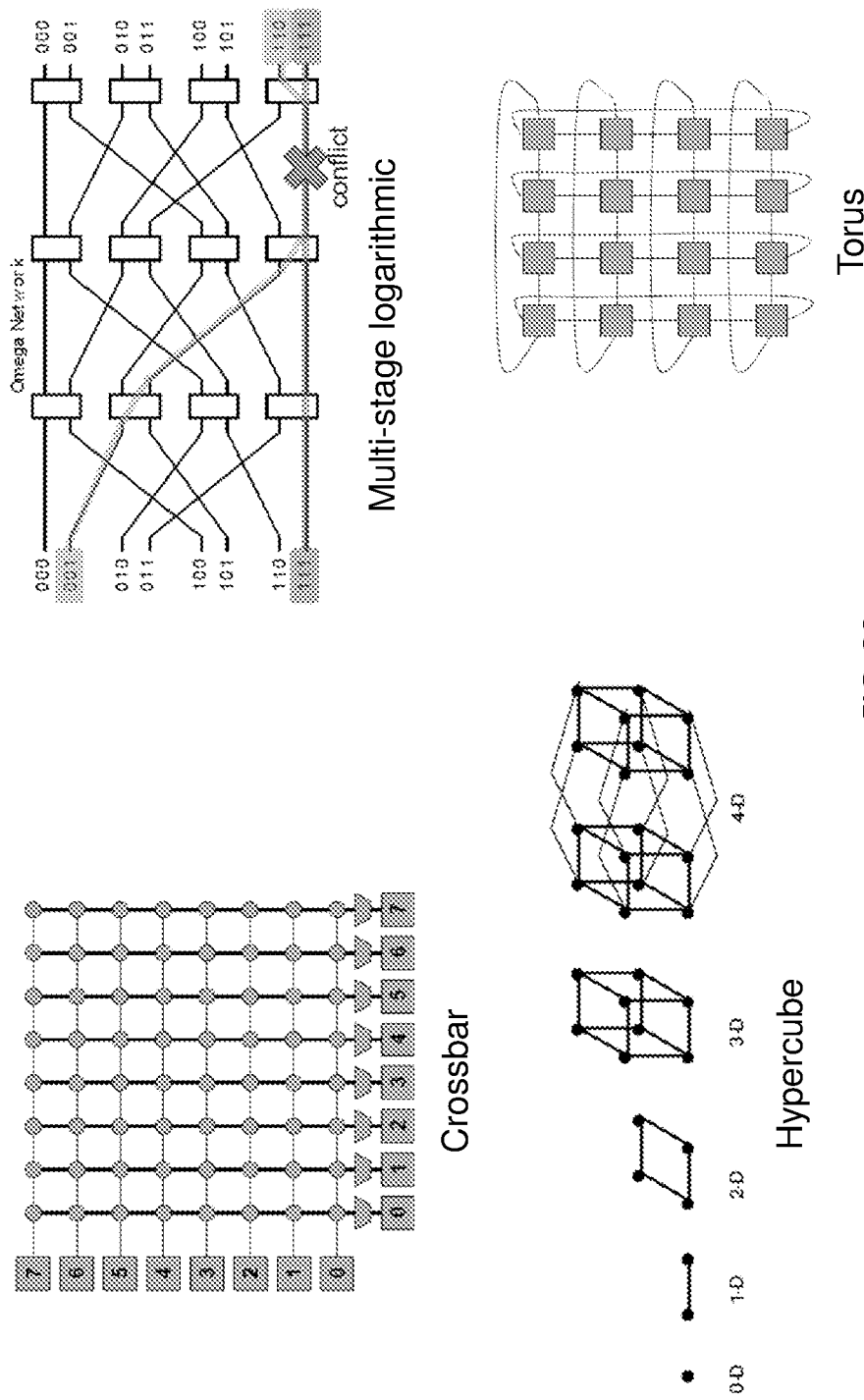
FIG. 30 shows examples of highly connected interconnect network topologies.

Other more highly connected IN topologies are widely used in various parallel processing and networking applications. These topologies include crossbar, multi-stage logarithmic, hypercube, and torus networks, for example as shown in FIG. 30. The ring, torus, and hypercube networks are all special cases of k-ary n-cube networks, which generally consist of 10 nodes, each with 2n connections (for $k>=3$). All of these topologies generally utilize far more than nearest-neighbor connectivity. The scalability of such INs may be severely limited when implemented with highly parallel electrical interconnects.

Figure 31:
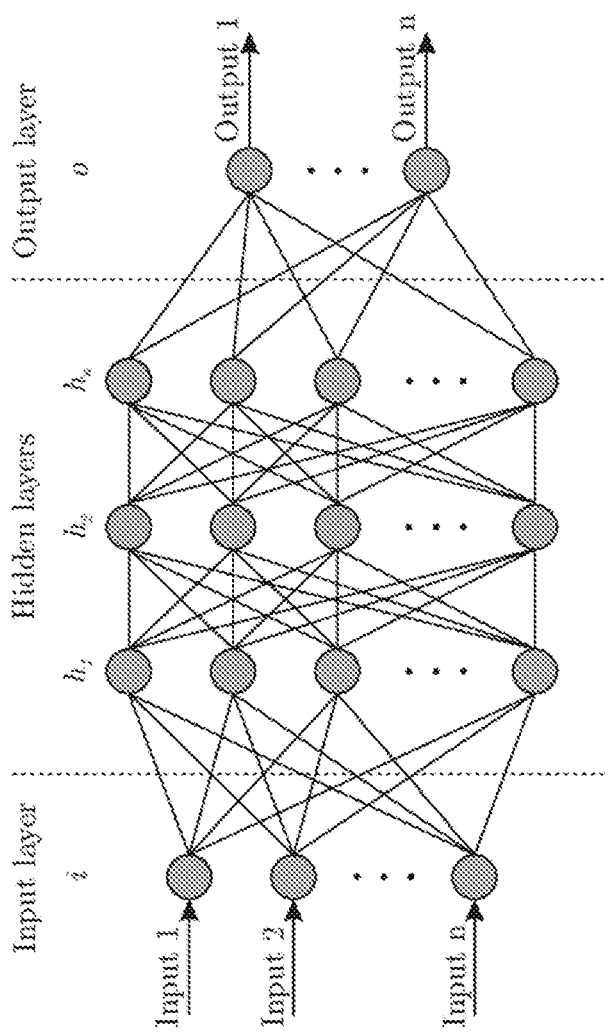
FIG. 31 shows an artificial neural network.

FIG. 31 shows an artificial neural network (ANN). Useful ANNs have generally very large numbers of nodes and very high connectivity between those nodes. This may pose an extreme challenge for electrical interconnects. An interesting feature of ANNs is that each node (other than those in the output layer) often broadcasts its output to many nodes in the next layer. This favors an interconnect technology that is adept at broadcasting signals. Optical interconnects based on microLEDs are, in fact, ideally suited to broadcasting due to the wide angular emission cone of the LEDs. This is discussed in more detail above, for example.

IN performance and utilized resources scale very differently for different network types. FIG. 32 compares mesh, multi-stage logarithmic, and crosspoint networks as a function of the number of interconnected nodes, N. Mesh networks generally utilize relatively few interconnects (which is desirable) but exhibit very high "blocking" (creation of some connections blocks the creation of others) and high latency, which is the number of link hops that are traversed by data. By contrast, crossbar networks are non-blocking and have very low latency but generally utilize very large numbers of links (order of $N^2$).

Parallel optical links (POLs) can support high link density and relatively physically long links. VLPOLs add the additional capability of flexible routing in three dimensions. This makes VLPOLs well-suited to use in complex physical topologies. Note that physical topologies are, in principle, independent of the logical interconnect topology being implemented. However, given very real practical limitations (e.g., only a limited number of routing layers in a planar physical topology), 3D physical topologies may enable far more scalability of highly interconnected logical topologies than do 2D (e.g., planar) physical topologies.

Figure 33:
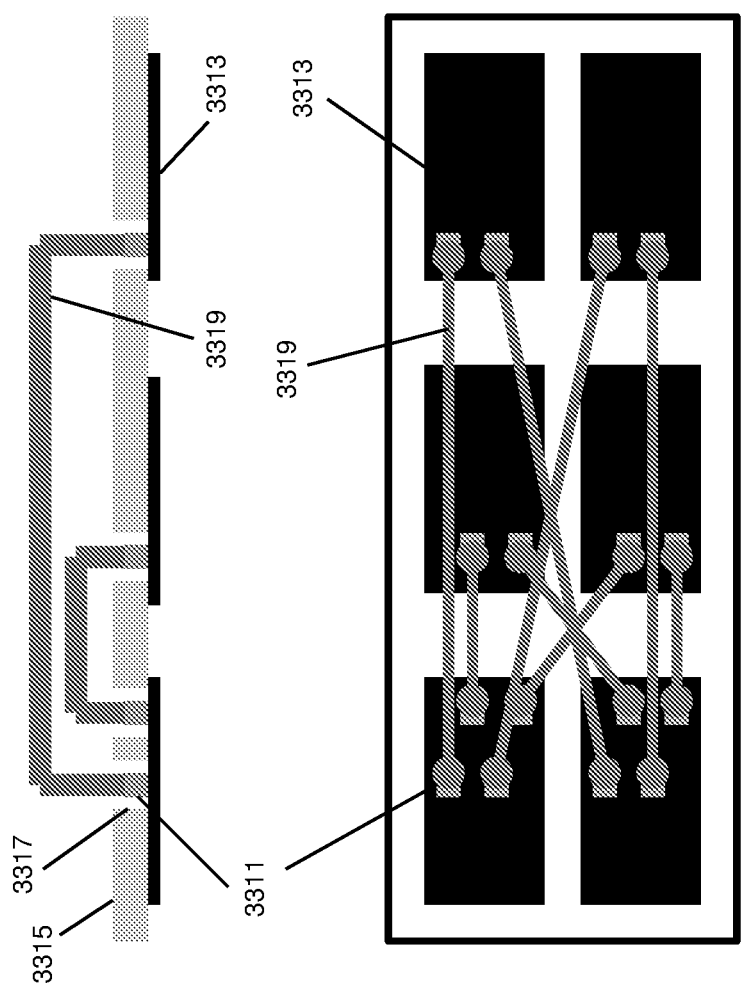
FIG. 33 shows the use of VLPOLs for passing information amongst ICs mounted to a planar substrate.

FIG. 33 shows the use of VLPOLs for passing information amongst ICs mounted to a planar substrate. In FIG. 33, OE device arrays 3311 are shown on ICs 3313, with multicore waveguides 3319 coupling various ones of the OEs. As shown in FIG. 33, the ICs are mounted to a substrate 3315, and the OE devices are in holes 3317 in the substrate. Each VLPOL traverses portions of the substrate and makes connections after traversing portions of the substrate. Physically long (~1 meter) connections generally do not pose a problem, allowing this approach to scale to communication of information amongst large numbers of ICs on very large substrates. Because VLPOLs are physically flexible and can be routed in 3D, they generally allow planar implementation of INs with large node counts and highly connected logical topologies, including those that may be impractical with electrical interconnections that are limited to a few signal routing layers.

Figure 34:
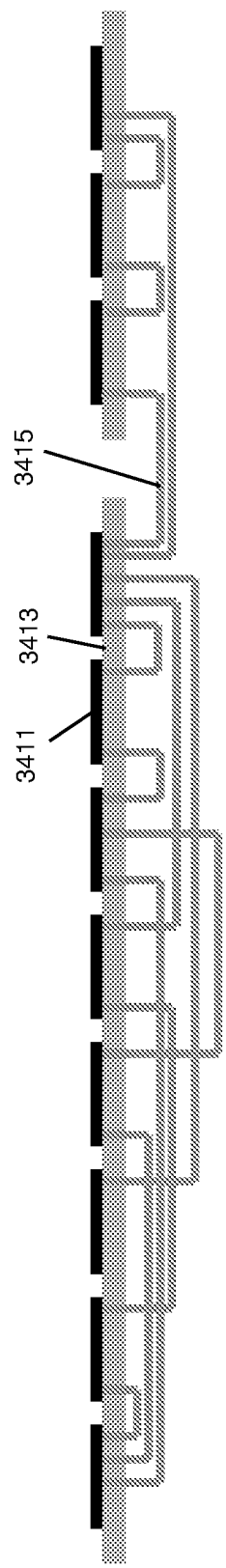
FIG. 34 shows the use of VLPOLs for providing data communications amongst ICs on multiple coplanar substrates.

FIG. 34 shows the use of VLPOLs for providing data communications amongst ICs 3411 on multiple coplanar substrates 3413. The substrates are shown with their top surfaces in the same plane. Each substrate contains one or more ICs and may have intra-substrate VLPOLs 3415. Because VLPOLs are generally not routed on the same substrates as the electronics, dense VLPOL connections can be made between substrates. Given constraints on substrate size, functionality, and yield, VLPOLs may provide a powerful technique for vastly increasing system scale and performance.

Figure 35:
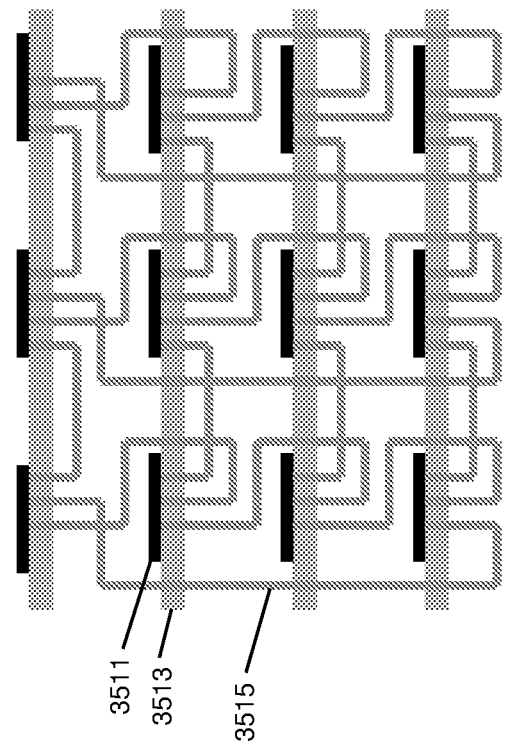
FIG. 35 shows the use of VLPOLs for connecting ICs mounted to stacked planar substrates.

As noted above, VLPOLs are not constrained to lie in a plane and may not be routed on the same substrate as the electronics or electrical communication lines. VLPOLs may therefore be useful and/or allow for substrates with ICs arranged in a non-planar manner. FIG. 35 shows the use of VLPOLs 3515 for connecting ICs 3511 mounted to stacked planar substrates 3513. It was discussed previously how an optical interconnect can go through a substrate using either holes in the substrate or a transparent substrate. By arranging ICs in a 3D stack of substrates rather than in a single plane, interconnect lengths can be significantly reduced. Adequate space can be left between the planes to allow removal of heat from the ICs by various means. The use of flexible optical waveguides enables traversing vertical dimension while being compatible with various heat removal techniques. In various embodiments such physical topologies may benefit from the use of 90° and 180° turning mirror elements.

In FIGS. 33, 34, and 35, some of the IC connections are to nearby ICs; such connections can be made with planar launched parallel optical links (PLPOLs) rather than VLPOLs. More generally, an implementation may mix PLPOL and VLPOL connections, with the PLPOL connections typically being used for nearby connections within a substrate.

Figure 36:
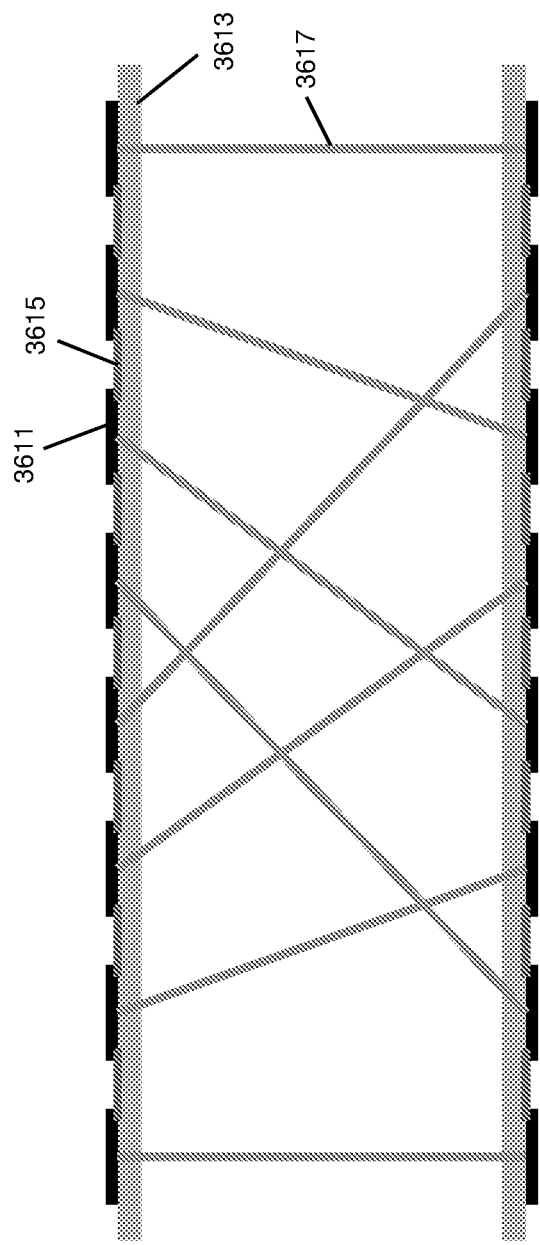
FIG. 36 shows a physical topology using planar substrates facing each other.

As noted above, highly parallel electronic interconnects may be best used for short nearest-neighbor connections such as in a mesh topology laid out in a plane. For many interesting processing and switching scenarios, this may be very inefficient because Order(sqrt(N)) hops are required to go from one corner of the mesh to the other. This hop count can be dramatically reduced with additional "long range" connections that allow data to jump over many mesh nodes in a single hop. FIG. 36 shows a very useful and powerful physical topology using planar substrates 3613 facing each other. The planar substrates each have ICs 3611. The ICs on a substrate, or adjacent ICs on a substrate in some embodiments, may have electrical connections 3615 between them. The ICs on different substrates, or some of the ICs on different substrates, have VLPOL connections 3617 between them. By splitting nodes across the two planes and providing appropriate long-range connections (e.g., using 2D perfect shuffle connectivity), the hop count can be dramatically reduced, e.g. to Order(log(N)).

FIG. 37 shows ICs 3711 mounted to substrates 3713 located around the periphery of a 3D shape and interconnected by VLPOLs 3715 through an interior of that shape. One or more ICs can be mounted to a given substrate that supports through optical connections as discussed above. A substrate may define one "facet" of the shape; the shape does not need to be regular. This a very general arrangement that supports a very high connection density while tending to reduce connection lengths. In some embodiments heat removal can conveniently be done around the periphery.

Rather than using flexible MW arrays, in some embodiments the physical topology of FIG. 37 may be implemented with MW arrays fabricated in a bulk optical medium such as glass. For example, in some embodiments the 3D shape may be a solid 3D shape, comprised of the bulk optical medium. Other optical components, including turning mirrors and lenses, may be fabricated in the same bulk medium. Various techniques including laser inscription (using a highly focused pulsed laser) and photorefractive writing can be used for fabricating these optical structures. In some embodiments the physical topology of FIG. 37 may be implemented with free-space optics including lenses, mirrors, and holographic optical elements (HOEs).

Figure 39:
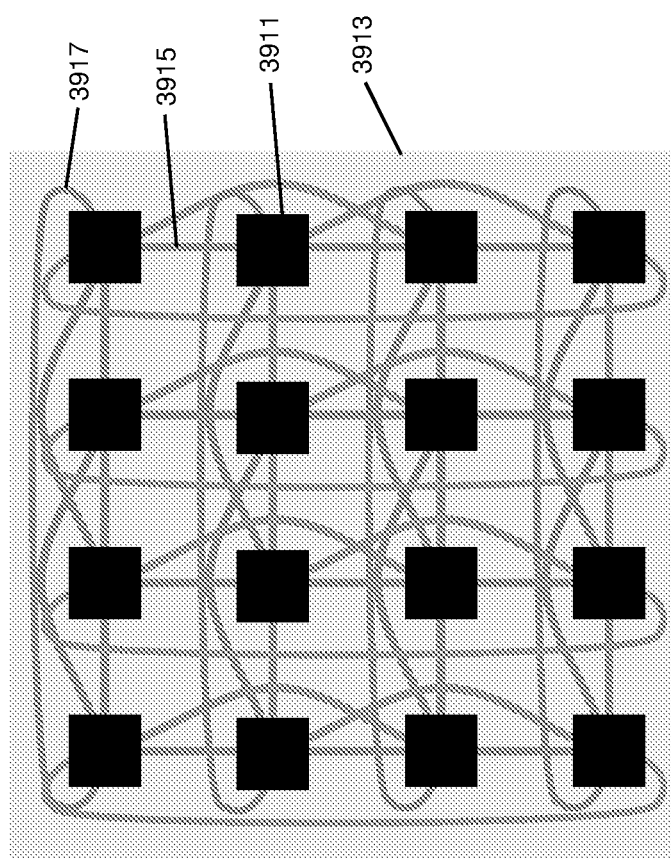
FIG. 39 shows a substrate with ICs connected by parallel optical links with a partial irregular hypercube interconnect topology.

FIG. 38a shows a 3-ary 2-cube network, while FIG. 38b shows a 4D hypercube (which is a 2-ary 4-cube); even for such modest dimensionality, the exploding connection complexity of these k-ary n-cube topologies is clear. FIG. 39 shows a planar substrate 3913 with ICs 3911. The ICs are connected by POLs with a partial irregular hypercube interconnect topology. The longer-range connections will tend to be VLPOLs 3917, while the nearby connections may be PLPOLs 3915 or VLPOLs. In some embodiments the physical topology of FIG. 35 is used, with the ICs mounted on a planar substrate and the VLPOLs traversing the substrate thickness, for example as discussed above. In some embodiments each of the POL interconnects can provide very high throughput (e.g., 4 Gbps per line×256 bits wide=1024 Gbps) with low latency and low power dissipation. The long links and complex connections may be prohibitive to implement in other technologies, yet much larger, more complex topologies can readily be implemented using POLs.

Although the invention has been discussed with respect to various embodiments, it should be recognized that the invention comprises the novel and non-obvious claims supported by this disclosure.

What is claimed is:

1. Optical interconnections for integrated circuit chips, comprising:
 a plurality of substrates, each substrate having holes traversing through a body of the substrate from a first side to a second side of the substrate;
 a plurality of integrated circuit chips mounted to the plurality of substrates;
 a plurality of optoelectronic devices including microLEDs and photodetectors on the plurality of integrated circuit chips, the plurality of optoelectronic devices being within the holes of the plurality of substrates;

a plurality of vertically launched parallel optical links (VLPOLs) optically fitting within the holes of the plurality of substrates and interconnecting at least some of the plurality of optoelectronic devices; and a plurality of planar launched parallel optical links (PLPOLs) optically interconnecting at least some of the plurality of optoelectronic devices.

2. The optical interconnections for integrated circuit chips of claim 1, wherein at least some of the substrates define a plane, at least some of the substrates defining different planes.

3. The optical interconnections for integrated circuit chips of claim 1, wherein the different planes are parallel to one another.

4. The optical interconnections for integrated circuit chips of claim 3, wherein at least some of the substrates define a same plane.

5. The optical interconnections for integrated circuit chips of claim 4, wherein PLPOLs interconnect integrated circuit chips on substrates defining the same plane and VLPOLs interconnect integrated circuit chips on substrates defining different planes.

6. The optical interconnections for integrated circuit chips of claim 1, wherein the different planes are not parallel to one another.

7. The optical interconnections for integrated circuit chips of claim 6, wherein the substrates are on surfaces of a bulk optical medium.

8. The optical interconnections for integrated circuit chips of claim 7, wherein the bulk optical medium includes optical components.

9. The optical interconnections for integrated circuit chips of claim 1, wherein the substrates define a same plane.

10. The optical interconnections for integrated circuit chips of claim 9, wherein the PLPOLs and VLPOLs have a partial irregular hypercube interconnect topology.

11. The optical interconnections for integrated circuit chips of claim 1, wherein the VLPOLs and PLPOLs are flexible multicore fibers.

12. The optical interconnections for integrated circuit chips of claim 1, wherein the VLPOLs and PLPOLs are multicore waveguides.

13. The optical interconnections for integrated circuit chips of claim 1, wherein the microLEDs of the plurality of optoelectronic devices each have an emitting region of less than or equal to 20 μm×20 μm.

14. The optical interconnections for integrated circuit chips of claim 1, wherein the microLEDs of the plurality of optoelectronic devices each have an end with a lens formed on said end.

* * * * *